United States Patent
Park et al.

(10) Patent No.: US 9,589,632 B2
(45) Date of Patent: Mar. 7, 2017

(54) RESISTIVE MEMORY DEVICE INCLUDING COLUMN DECODER AND METHOD OF PERFORMING A BIDIRECTIONAL DRIVING OPERATION AND PROVIDING APPROPRIATE BIASING WITH RESPECT TO BIT LINES

(71) Applicants: Hyun-Kook Park, Anyang-si (KR); Chi-Weon Yoon, Seoul (KR); Yeong-Taek Lee, Seoul (KR)

(72) Inventors: Hyun-Kook Park, Anyang-si (KR); Chi-Weon Yoon, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/820,197

(22) Filed: Aug. 6, 2015

(65) Prior Publication Data
US 2016/0172028 A1    Jun. 16, 2016

(30) Foreign Application Priority Data
Dec. 16, 2014 (KR) .......................... 10-2014-0181614

(51) Int. Cl.
| G11C 11/00 | (2006.01) |
| G11C 13/00 | (2006.01) |
| G11C 11/16 | (2006.01) |
| G11C 11/22 | (2006.01) |

(52) U.S. Cl.
CPC ...... *G11C 13/0026* (2013.01); *G11C 11/1655* (2013.01); *G11C 11/1657* (2013.01); *G11C 11/1673* (2013.01); *G11C 11/1675* (2013.01); *G11C 11/2255* (2013.01); *G11C 13/004* (2013.01); *G11C 13/0028* (2013.01); *G11C 13/0069* (2013.01)

(58) Field of Classification Search
CPC ............ G11C 13/0069; G11C 13/0004; G11C 13/0007
USPC .................. 365/148, 230.03, 230.06, 230.07
See application file for complete search history.

(56) References Cited

U.S. PATENT DOCUMENTS

| 2012/0099367 A1* | 4/2012 | Azuma | .............. G11C 13/0007 365/148 |
| 2015/0109858 A1* | 4/2015 | Ha | ..................... G11C 16/3427 365/185.02 |
| 2015/0243355 A1* | 8/2015 | Lee | .................... G11C 13/0069 365/148 |

* cited by examiner

*Primary Examiner* — Connie Yoha
(74) *Attorney, Agent, or Firm* — Volentine & Whitt, PLLC

(57) ABSTRACT

A resistive memory device includes a column decoder having a first switch unit, including at least one pair of switches arranged in correspondence to each of a plurality of signal lines, and a second switch unit including a pair of switches arranged in correspondence to the at least one pair of switches of the first switch unit. A first pair of switches of the first switch unit includes a first switch and a second switch that are of the same type, and a second pair of switches of the second switch unit includes a third switch and a fourth switch that are connected to the first pair of switches. A selection voltage is provided to the first signal line by passing through the first switch, and an inhibit voltage is provided to the first signal line by selectively passing through the first switch or the second switch.

20 Claims, 27 Drawing Sheets

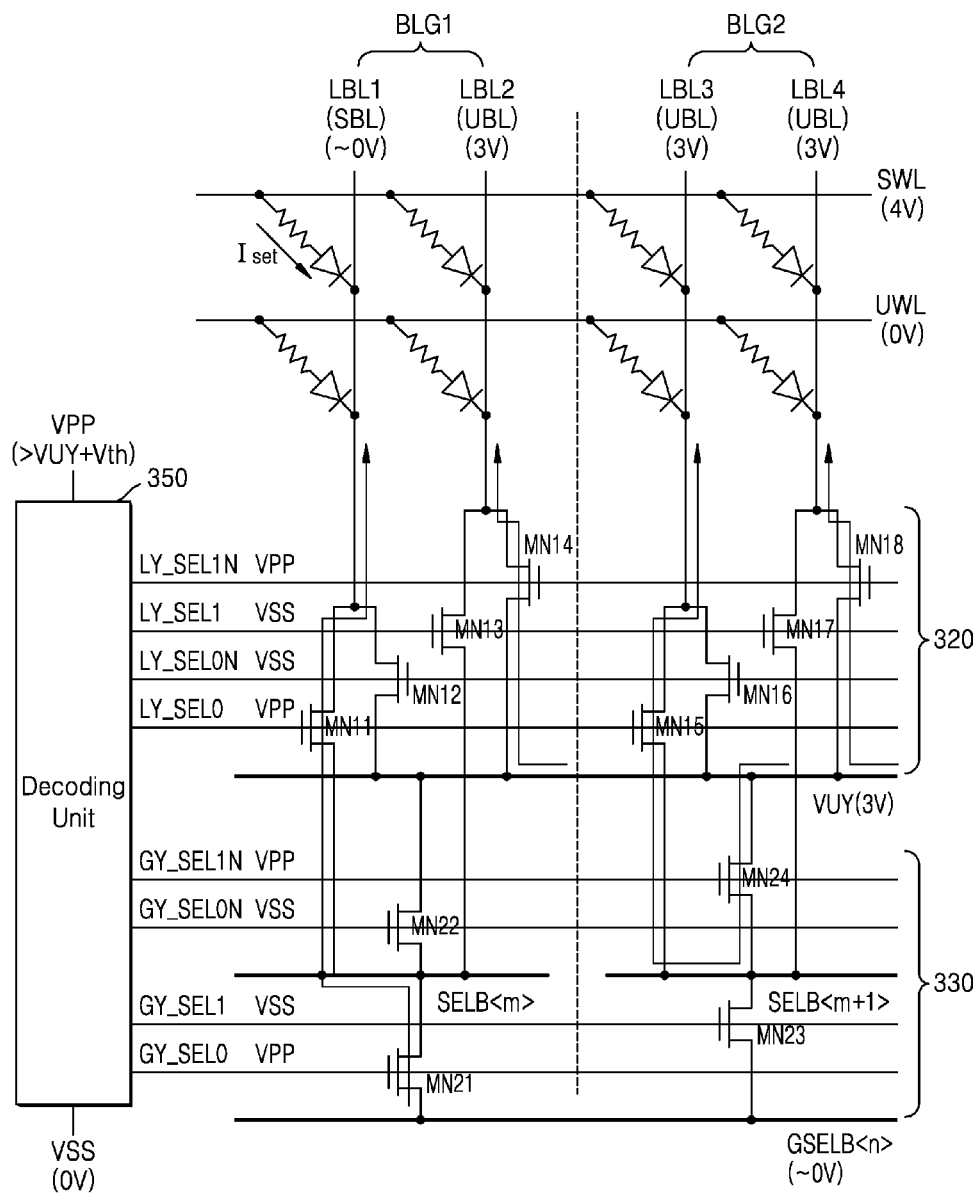

RESISTIVE MEMORY DEVICE INCLUDING COLUMN DECODER AND METHOD OF PERFORMING A BIDIRECTIONAL DRIVING OPERATION AND PROVIDING APPROPRIATE BIASING WITH RESPECT TO BIT LINES

CROSS-REFERENCE TO RELATED APPLICATION

This application claims the benefit of Korean Patent Application No. 10-2014-0181614, filed on Dec. 16, 2014, in the Korean Intellectual Property Office, the disclosure of which is incorporated herein in its entirety by reference.

BACKGROUND

The disclosure relates to a resistive memory device, and more particularly, to a resistive memory device including a column decoder that is capable of performing a bidirectional driving operation, and a method of operating the same.

According to demand for a memory device having high capacity and low power consumption, research into next-generation memory devices that are non-volatile and do not require a refresh operation is being conducted. The next-generation memory devices are required to have a high integrity characteristic of Dynamic Random Access Memory (DRAM), a non-volatile characteristic of flash memory, and a high speed of static RAM (SRAM). As the next-generation memory devices, Phase change RAM (PRAM), Nano-Floating Gate Memory (NFGM), Polymer RAM (PoRAM), Magnetic RAM (MRAM), Ferroelectric RAM (FeRAM), and a Resistive RAM (RRAM) have been highlighted.

SUMMARY

The disclosure describes a resistive memory device that is capable of a performing a bidirectional driving operation and providing appropriate biasing with respect to bit lines. The disclosure also describes a method of operating such a resistive memory device.

According to an aspect of the disclosure, there is provided a resistive memory device including a memory cell array including memory cells connected to a plurality of signal lines, and a column decoder including a first switch unit including at least one pair of switches arranged in correspondence to each of the plurality of signal lines and a second switch unit including a pair of switches arranged in correspondence to the at least one pair of switches of the first switch unit. The first switch unit includes a first pair of switches connected to a first signal line, wherein the first pair of switches includes a first switch and a second switch that are of the same type. The second switch unit includes a second pair of switches including a third switch and a fourth switch that are connected to the first pair of switches. A selection voltage is provided to the first signal line by passing through the first switch, and an inhibit voltage is provided to the first signal line by selectively passing through the first switch or the second switch.

According to another aspect of the disclosure, there is provided a resistive memory device including a memory cell array including memory cells connected to a plurality of signal lines, a column decoder including a first switch unit including switches that are arranged in correspondence to each of the plurality of signal lines in order to drive the plurality of signal lines, and a second switch unit including switches adjusting a voltage transfer path in order to bi-directionally drive the memory cells, and a write/read circuit performing write and read operations with respect to the memory cells via the column decoder. The second switch unit further includes a biasing switch unit controlling an inhibit voltage to be provided to at least one of the plurality of signal lines via an additional voltage transfer path, regardless of the bidirectional driving with respect to the plurality of signal lines.

According to another aspect of the disclosure, there is provided a column decoder for driving a plurality of signal lines, the column decoder including a first NMOS transistor connected between a first signal line and a first line, a second NMOS transistor connected between the first signal line and a second line transferring an inhibit voltage, a third NMOS transistor connected between the first line and a third line transferring a selection voltage, and a fourth NMOS transistor connected between the second line and the third line. The first line selectively transfers the selection voltage or the inhibit voltage according to a switching state of the third and fourth NMOS transistors. When the first signal line is selected, the selection voltage is provided to the first signal line via a path including the third NMOS transistor, the first line, and the first NMOS transistor.

According to another aspect of the disclosure, there is provided an address decoder that identifies an address line of a memory cell of a nonvolatile memory device to which data will be programmed or from which data will be retrieved. The address decoder includes the address line that, in conjunction with one or more additional address lines, addresses the memory cell of the memory device. A first switch electrically connects the address line with a local selection signal line when the first switch is closed and electrically disconnects the address line from the local selection signal line when the first switch is open. A second switch electrically connects the address line with a program-inhibit signal line when the second switch is closed and electrically disconnects the address line from the program-inhibit signal line when the second switch is open. A third switch electrically connects the program-inhibit signal line with the local selection signal line when the third switch is closed and electrically disconnects the program-inhibit signal line from the local selection signal line when the third switch is open. A fourth switch electrically connects the local selection signal line with a global selection signal line when the fourth switch is closed and electrically disconnects the local selection signal line from the global selection signal line when the fourth switch is open.

According to an aspect of the disclosure, there is provided an address decoder that identifies an address line of a memory cell of a nonvolatile memory device to which data will be programmed or from which data will be retrieved. The address decoder includes the address line that, in conjunction with one or more additional address lines, addresses the memory cell of the memory device. A first switch electrically connects the address line with a first local selection signal line when the first switch is closed and electrically disconnects the address line from the first local selection signal line when the first switch is open. A second switch electrically connects the address line with a second local selection signal line when the second switch is closed and electrically disconnects the address line from the second local selection signal line when the second switch is open. A third switch electrically connects the first local selection signal line with a global selection signal line when the third switch is closed and electrically disconnects the first local selection signal line from the global selection signal line when the third switch is open. A fourth switch electrically connects the first local selection signal line with a program-inhibit signal line when the fourth switch is closed and electrically disconnects the first local selection signal line from the program-inhibit signal line when the fourth switch is open.

BRIEF DESCRIPTION OF THE DRAWINGS

Exemplary embodiments of the disclosure will be more clearly understood from the following detailed description taken in conjunction with the accompanying drawings in which:

FIGS. 13A and 13B are circuit diagrams illustrating another example of an operation of the column decoder of FIG. 10;

DETAILED DESCRIPTION OF THE EMBODIMENTS

Figure 1:
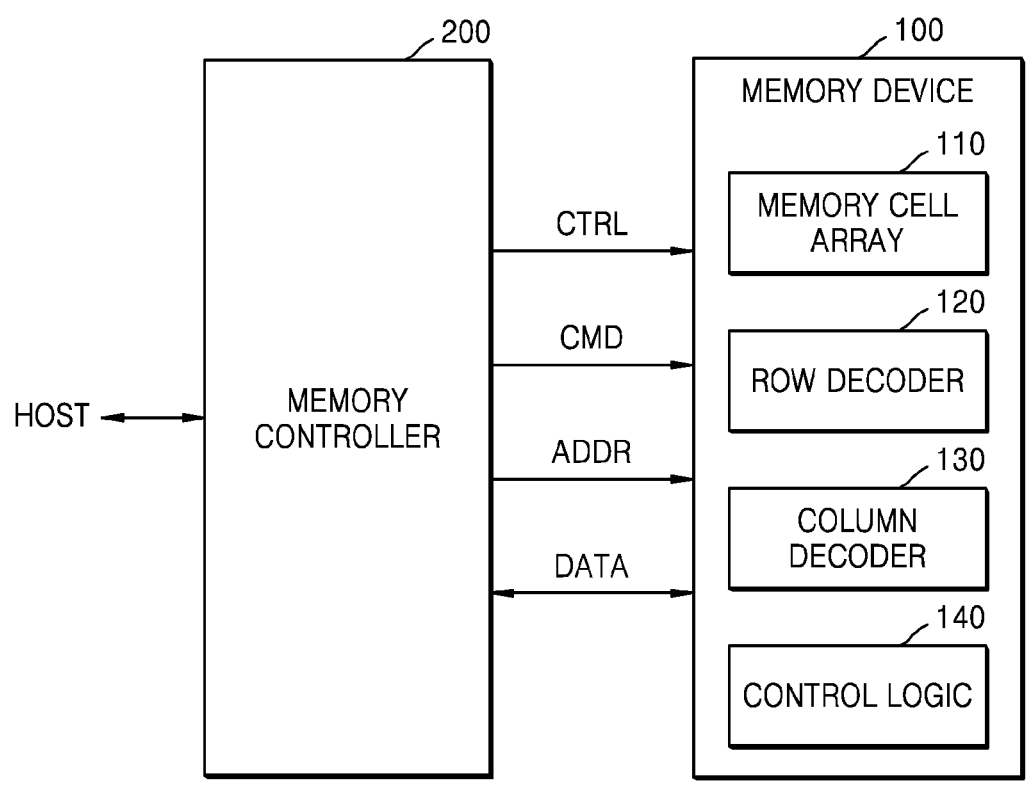
FIG. 1 is a block diagram illustrating a memory system including a memory device according to an exemplary embodiment.

The present disclosure will now be described more fully with reference to the accompanying drawings, in which exemplary embodiments of the disclosure are shown. The disclosure may, however, be embodied in many different forms, and should not be construed as being limited to the embodiments set forth herein. Thus, the disclosure may include all revisions, equivalents, or substitutions which are included in the concept and the technical scope related to the present disclosure. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify the existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the disclosure.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram illustrating a memory system 10 including a memory device 100 according to an exemplary embodiment. According to the present exemplary embodiment, the memory device 100 may be referred to as a resistive memory device since the memory system 10 includes resistive memory cells. Alternatively, the memory device 100 may include various types of memory cells. For example, as the memory cells are disposed on regions where a plurality of first signal lines and a plurality of second signal lines cross each other, the memory device 100 may be referred to as a cross-point memory device. Hereinafter, the memory device 100 is assumed to be a resistive memory device.

Referring to FIG. 1, the memory system 10 may include the memory device 100 and a memory controller 200. The memory device 100 may include a memory cell array 110, a row decoder 120, a column decoder 130, and a control logic 140. When the memory cell array 110 includes resistive memory cells, the memory system 10 may be referred to as a resistive memory system.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation and a read operation with respect to the memory device 100. Also, write-target data DATA and read data DATA may be exchanged between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, Advanced Technology Attachment (ATA), Serial-ATA, Parallel-ATA, SCSI, ESDI, and Integrated Drive Electronics (IDE).

The memory cell array 110 may include a plurality of memory cells (not shown) that are disposed respectively on regions where a plurality of first signal lines and a plurality of second signal lines cross each other. In some exemplary embodiments, the plurality of first signal lines may be a plurality of bit lines, and the plurality of second signal lines may be a plurality of word lines. In other exemplary embodiments, the first signal lines may be word lines, and the second signal lines may be bit lines. According to the present exemplary embodiment, the word lines and the bit lines do not need to be defined as separate concepts. In other words, each of the plurality of memory cells may be connected between two signal lines arranged to cross each other, wherein one signal line may be a word line and the other signal line may be a bit line. Also, a write driver and a sense amplifier (not shown) may be arranged for writing/reading operations. It may be described that the write driver/sense amplifier is connected to an end of the word line or an end of the bit line.

In the present exemplary embodiment, each of the memory cells may be a single level cell (SLC) that stores one-bit data, or may be a multilevel cell (MLC) that may store at least two-bit data. Alternatively, the memory cell array 110 may include both the SLC and the MLC. When one-bit data is written to one memory cell, the memory cells may have two resistance level distributions according to the written data. Alternatively, when two-bit data is written to one memory cell, the memory cells may have four resistance level distributions according to the written data. In other embodiments, if a memory cell is a triple level cell (TLC) that stores three-bit data, the memory cells may have eight resistance level distributions according to the written data. However, one or more exemplary embodiments of the disclosure are not limited thereto, and according to another exemplary embodiment, each of the memory cells may store at least four-bit data.

In some exemplary embodiments, the memory cell array 110 may include memory cells with a two-dimensional horizontal structure. In other exemplary embodiments, the memory cell array 110 may include memory cells with a three-dimensional vertical structure.

The memory cell array 110 may include resistive memory cells that include a variable resistor device (not shown). As one example, when the resistance of the variable resistor device that is formed of a phase change material (e.g., Ge—Sb—Te) is changed according to temperature, a resistive memory device may be Phase change RAM (PRAM). As another example, when the variable resistor device is formed of complex metal oxide including an upper electrode, a lower electrode, and transition metal oxide therebetween, a resistive memory device may be Resistive RAM (RRAM). As another example, when the variable resistor device is formed of an upper electrode of a magnetic material, a lower electrode of a magnetic material, and a dielectric therebetween, a resistive memory device may be Magnetic RAM (MRAM).

The row decoder 120 may drive a plurality of word lines and the column decoder 130 may drive a plurality of bit lines. The row decoder 120 may include a decoding device for decoding a row address, and a switch device, the switching of which is controlled in response to various row control signals according to a result of the decoding. Similarly, the column decoder 130 may include a decoding device for decoding a column address, and a switch device, the switching of which is controlled in response to various column control signals according to a result of the decoding.

The control logic 140 may control overall operations of the memory device 100. The control logic 140 may control the row decoder 120 and the column decoder 130 to perform an operation of selecting a memory cell. For example, the control logic 140 may generate a row address and a column address by processing an address from the outside. The memory device 100 may include a power generating device (not shown) for generating various write voltages and read voltages, which are used in the writing and reading operations, and the write voltage/read voltage may be provided to a memory cell via the row decoder 120 and the column decoder 130, under a control of the control logic 140.

In a write operation performed on the memory device 100, variable resistance of a memory cell of the memory cell array 110 may increase or be reduced according to written data. For example, each of the memory cells of the memory cell array 110 may have a resistance value according to currently stored data, and the resistance value of the memory cell array 110 may increase or be reduced according to data that is to be written to each of the memory cells. A write operation as described above may be classified as a reset write operation and a set write operation.

Meanwhile, data write methods may be divided into a unidirectional write method and a bidirectional write method. According to the unidirectional write method, a difference in voltages applied to both ends of a memory cell may have the same polarity, while in the reset write operation and the set write operation (for example, the difference may have a first polarity, since a voltage level of the bit line is high). On the contrary, according to the bidirectional write method, the difference in voltages applied to both ends of the memory cell may have different polarities, while in the reset write operation and the set write operation. For example, while in the reset write operation, since the voltage level of the bit line is relatively higher than the voltage level of the word line, the difference in voltages applied to both ends of the memory cell may have the first polarity, in the set write operation, since the voltage level of the word line is relatively higher than the voltage level of the bit line, the difference in voltages applied to both ends of the memory cell may have a second polarity. In addition, the resistive memory cells according to the present exemplary embodiment may be driven by using various methods. The voltage level of the word line may be relatively high in the reset write operation, and the voltage level of the bit line may be relatively high in the set write operation.

Meanwhile, when the difference in voltages applied to both ends of a resistive memory cell occurs, a leakage current may be generated in non-selected resistive memory cells. To decrease the leakage current, an inhibit voltage of an appropriate level may be applied to non-selected words lines and non-selected bit lines. According to each operation mode, such as a set write, a reset write, and a read operation, voltages of various levels may be provided to a selection word line, non-selected word line, selection bit line, and non-selected bit line.

According to the present exemplary embodiment, the column decoder 130 of the resistive memory device 100 is capable of performing a bidirectional write operation on a memory cell, and has an optimized switch structure that provides a selection voltage to a selection line (for example, the selection bit line) and provides appropriate biasing to a non-selected line (for example, the non-selected bit line). For example, since the column decoder 130 according to the present exemplary embodiment has a hierarchical structure, the column decoder 130 may include a local switch unit (not shown) controlling switching with respect to local bit lines and a global switch unit (not shown) controlling switching with respect to global bit lines. In the local switch unit, two or more switches (for example, a pair of switches) may be arranged in correspondence to one local bit line, and transferring of a selection voltage may be controlled via any one (a first switch) of the pair of switches, and transferring of an inhibit voltage may be controlled via the other (a second switch) of the pair of switches. Also, the pair of switches may include switches of the same type, and may include, for example, two NMOS transistors as the switches.

In the global switch unit, two or more switches (for example, a pair of switches) may be arranged in correspondence to one local bit line group including a plurality of local bit lines. In the global switch unit, the pair of switches may include a switch (a first switch) related to transferring of a selection voltage, and a switch (a second switch) related to transferring of an inhibit voltage. The pair of switches of the global switch unit may also include switches of the same type, and may include, for example, two NMOS transistors as the switches.

With the above configuration, when an inhibit voltage is provided to a non-selected local bit line, the inhibit voltage may be transferred via a path passing through the second switch of each pair of switches of the local switch unit and via a path passing through the second switch of each pair of switches of the global switch unit. Since the inhibit voltage may be transferred via various transferring paths, the inhibit voltage may be appropriately provided with respect to the non-selected local bit lines, and the non-selected local bit lines may be prevented from being floated.

Also, according to the present exemplary embodiment, for appropriate biasing with respect to the non-selected lines, the column decoder 130 may include a biasing switch device which may be turned on or off regardless of a control signal (for example, a column control signal) related to addressing for selecting a memory cell. The column decoder 130 may generate at least one additional control signal regardless of addressing for selecting a memory cell, and the biasing switch device may provide the inhibit voltage to the local bit lines in response to the additional control signal. For example, when all local bit lines in the local bit line group are not selected, the local bit lines in the local bit line group may become floated according to the addressing. However, according to the present exemplary embodiment, the biasing switch device corresponding to the local bit line group may be activated to provide the inhibit voltage to the local bit lines of the local bit line group.

According to the present exemplary embodiment, the bidirectional operation with respect to the memory cell is possible and the appropriate biasing with respect to a plurality of lines (for example, bit lines) is possible. Also, since an increase in the number of switches needed for the bidirectional operation and the biasing is minimized, an increase of an area needed for the column decoder 130 may be minimized. Furthermore, an increase in the number of control signals needed for controlling the switches may be minimized.

The memory controller 200 and the memory device 100 may be integrated into a semiconductor device. For example, the memory controller 200 and the memory device 100 may be integrated into a semiconductor device and thus may configure a memory card. As one example, the memory controller 200 and the memory device 100 may be integrated into a semiconductor device and thus may configure a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). As another example, the memory controller 200 and the memory device 100 may be integrated into a semiconductor device and thus may configure a Solid State Disk/Drive (SSD).

Figure 2:
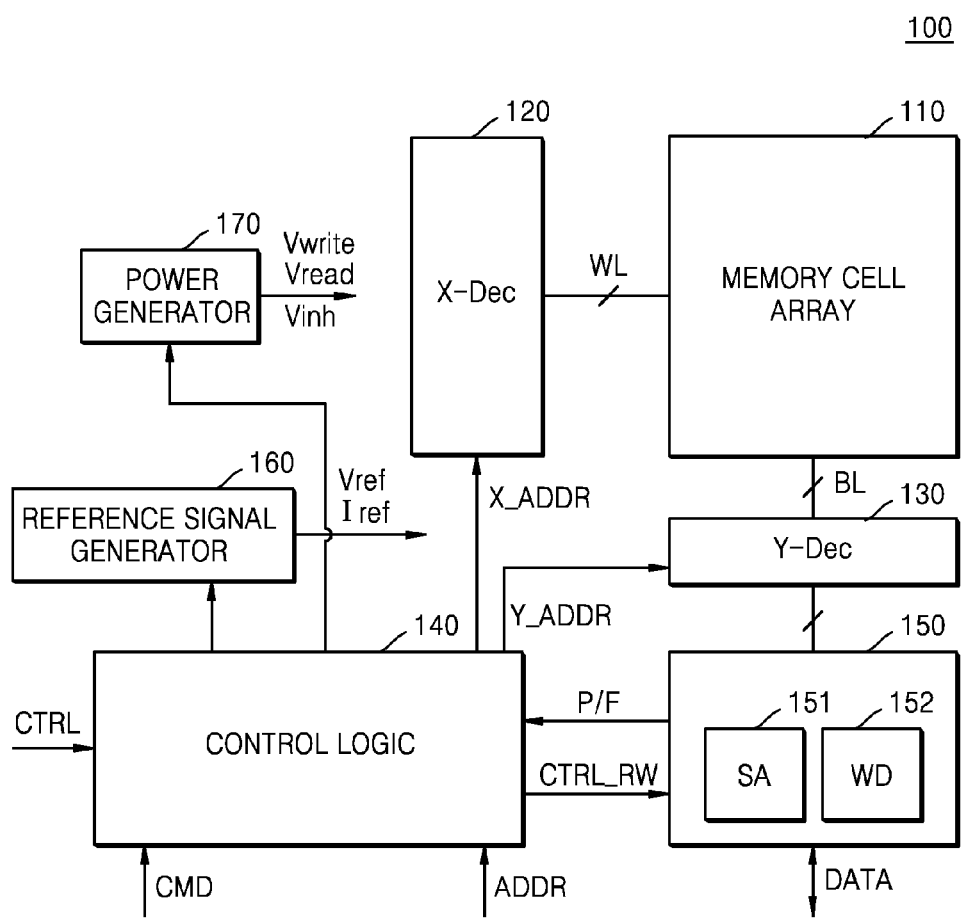
FIG. 2 is a block diagram illustrating the memory device of FIG. 1.

An operation of the memory device 100 included in the memory system 10 that may be configured as described above is described below. FIG. 2 is a block diagram illustrating the memory device 100 of FIG. 1.

Referring to FIG. 2, the memory device 100 may include the memory cell array 110, the row decoder 120, the column decoder 130, and the control logic 140. Also, the memory device 100 may further include a write/read circuit 150, a reference signal generator 160, and a power generator 170. Also, the write/read circuit 150 may include a sense amplifier 151 and a write driver 152.

An operation of the memory device 100 illustrated in FIG. 2, according to an exemplary embodiment is as follows:

Memory cells included in the memory cell array 110 may be connected to a plurality of word lines WL and a plurality of bit lines BL. As various voltage signals or current signals are provided via the bit lines BL and the word lines WL, data is written or read to or from selected memory cells, and the remaining non-selected memory cells may be prevented from being written or read.

An address ADDR indicating an access-target memory cell may be received in addition to a command CMD. The address ADDR may include a row address X_ADDR for selecting a word line of the memory cell array 110 and a column address Y_ADDR for selecting a bit line of the memory cell array 110. The row decoder 120 performs a word line selecting operation in response to the row address X_ADDR, and the column decoder 130 performs a bit line selecting operation in response to the column address Y_ADDR.

The write/read circuit 150 may be connected to the bit lines BL and thus may write data to a memory cell or may read data from the memory cell. In some exemplary embodiments, the power generator 170 may generate a write voltage Vwrite used for a write operation and a read voltage Vread used for a read operation. The write voltage Vwrite includes various voltages related to the write operation, and may include a set voltage and a reset voltage. Also, the power generator 170 may generate an inhibit voltage Vinh for biasing non-selected lines. The write voltage Vwrite, the read voltage Vread, and the inhibit voltage Vinh may be provided to the bit lines BL via the column decoder 130 or to the word lines WL via the row decoder 170.

Meanwhile, the reference signal generator 160 may generate a reference voltage Vref and a reference current Iref, as various reference signals related to a data read operation. For example, the sense amplifier 151 may be connected to a node (for example, a sensing node) of the bit line BL to determine data, and a data value may be determined by comparing a voltage of the sensing node with the reference voltage Vref. Alternatively, when a current sensing method is used to determine data, the reference signal generator 160 may generate the reference current Iref and provide the reference current Iref to the memory cell array 110, and the data value may be determined by comparing a voltage of the sensing node due to the reference current Iref with the reference voltage Vref.

Also, the write/read circuit 150 may provide a pass/fail signal P/F according to a result of reading the read data, to the control logic 140. The control logic 140 may control a write and read operation of the memory cell array 110 based on the pass/fail signal P/F.

The control logic 140 may output various control signals CTRL_RW for writing data to the memory cell array 110 or reading data from the memory cell array 110, based on a command CMD, an address ADDR, and a control signal CTRL received from the memory controller 200. By doing so, the control logic 140 may control various overall operations in the memory device 100.

According to the present exemplary embodiment, the column decoder 130 may generate various internal control signals by decoding a column address Y_ADDR, and may provide the write voltage Vwrite, the read voltage Vread, and the inhibit voltage Vinh to the bit lines BL, according to the internal control signals. Although not illustrated in FIG. 2, the column decoder 130 may receive one or more control signals from the control logic 140, in addition to the internal control signals, and may drive the bit lines BL by using the control signals.

Figure 3:
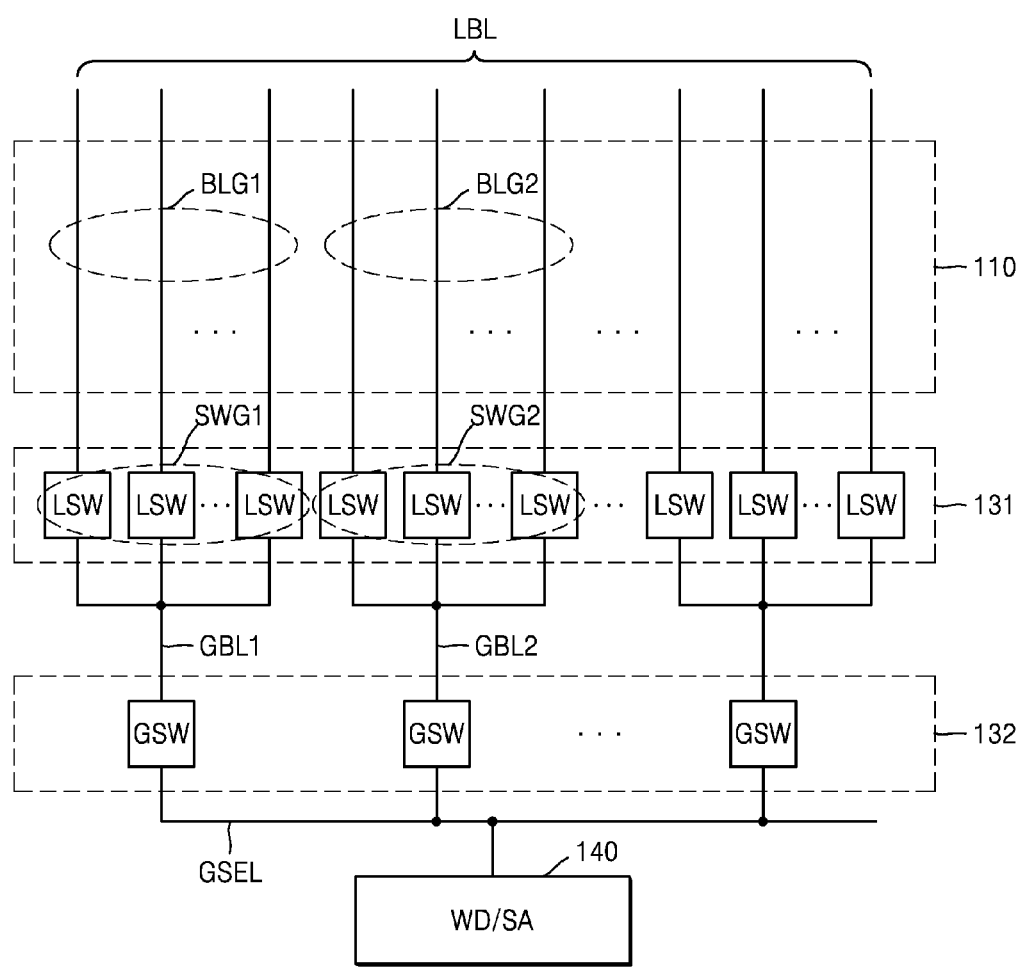
FIG. 3 is a block diagram illustrating a column decoder of FIG. 2.

FIG. 3 is a block diagram illustrating the column decoder 130 of FIG. 2. As illustrated in FIG. 3, the memory cell array 110 may include a plurality of bit lines connected to memory cells, and the bit lines connected to the memory cells may be referred to as local bit lines LBL. The local bit lines LBL may include a plurality of bit line groups BLG1, BLG2, . . . BLG4, and each of the bit line groups may include a plurality of local bit lines. Also, global bit lines GBL1, GBL2, . . . may be arranged in correspondence to the bit line groups BLG1, BLG2, . . . BLG4.

Meanwhile, the column decoder 130 may include a local switch unit 131 controlling a connection between the local bit lines LBL and the global bit lines GBL1, GBL2, . . . , and a global switch unit 132 controlling a connection between the global bit lines GBL1, GBL2, . . . , and the write/read circuit 140. The global bit lines GBL1, GBL2, . . . may be connected to a predetermined line GSEL to which a selection voltage is transferred via the global switch unit 132. In the local switch unit 131, a local switch LSW arranged in correspondence to one local bit line LBL may include two or more switches. Also, in the global switch unit 132, a global switch GSW arranged in correspondence to one global bit line GBL may include two or more switches.

Meanwhile, in FIG. 3, the local switch unit 131 and the global switch unit 132 may be controlled by using various methods. For example, the local switch LSW of the local switch unit 131 of FIG. 3, which corresponds to each of the local bit lines, may be separately controlled. Alternatively, the memory cell array 110 of FIG. 3 may be divided into at least two regions, and the local switches LSW of the local switch unit 131, which correspond to different regions, may share a control signal line. For example, when the first bit line group BLG1 and the second bit line group BLG2 correspond to different regions from each other, first group switches SWG1 of the local switch unit 131 and second group switches SWG2 of the local switch unit 131 respectively corresponding to the bit line groups BLG1 and BLG2 may share a control signal. According to the present exemplary embodiment, in the memory device 100, the implementation of which may vary as described above, appropriate biasing is provided to the plurality of local bit lines LBL.

Figure 4:
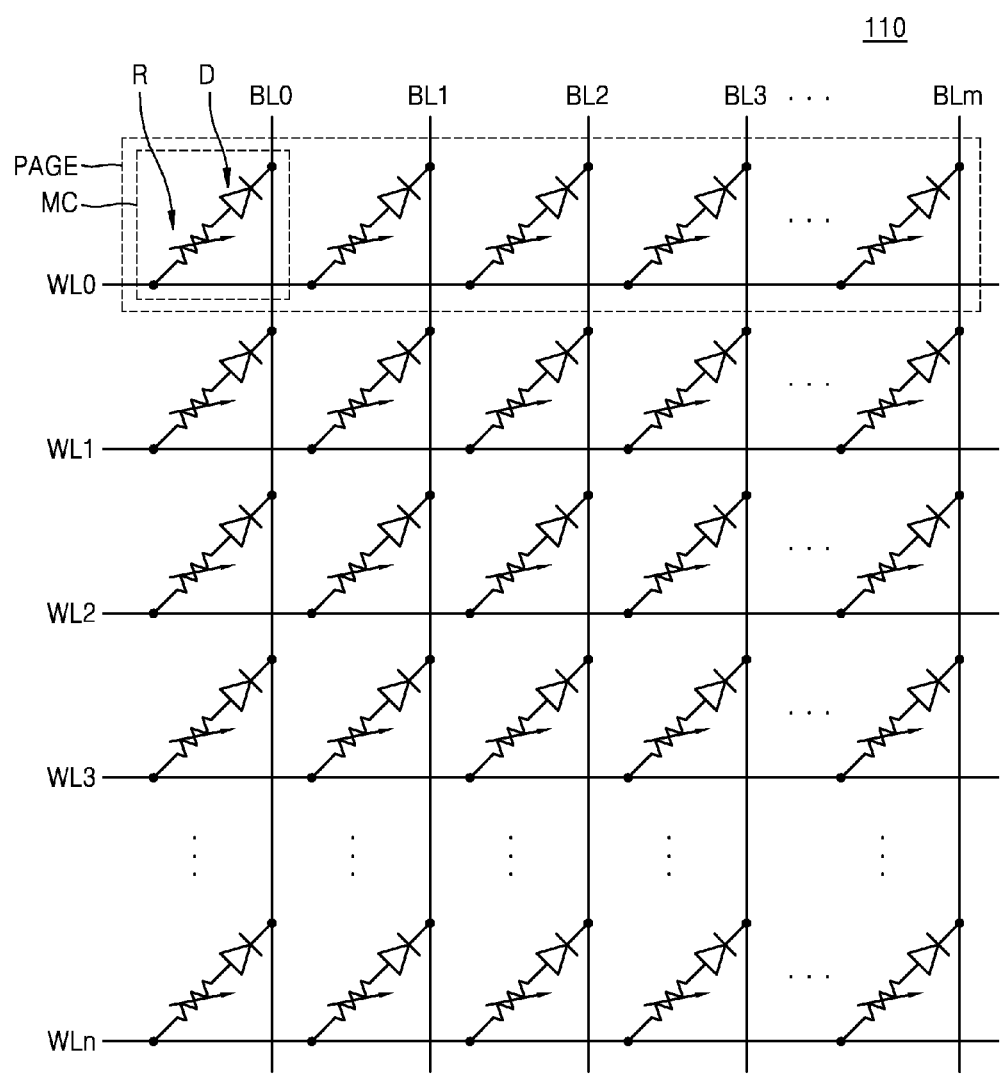
FIG. 4 is a circuit diagram illustrating a memory cell array of FIG. 2.

FIG. 4 is a circuit diagram illustrating the memory cell array 110 of FIG. 2. The memory cell array 110 may include a plurality of cell regions. In FIG. 4, one cell region is illustrated, and the cell region may be, for example, a tile.

Referring to FIG. 4, the memory cell array 110 may include a plurality of word lines WL0 through WLn, a plurality of bit lines BL0 through BLm, and a plurality of memory cells MC. Here, the number of word lines WL, the number of bit lines BL, and the number of memory cells MC may vary according to one or more exemplary embodiments. Also, the memory cells MC that are connected by one word line may be defined as a page unit PAGE.

Each of the plurality of memory cells MC may include a variable resistor device R and a selection device D. The variable resistor device R may also be referred to as a variable resistance material, and the selection device D may also be referred to as a switching device.

In some exemplary embodiments, the selection device D may be connected between one of the plurality of bit lines BL0 through BLm and the variable resistor device R, and the variable resistor device R may be connected between the selection device D and one of the plurality of word lines WL0 through WLn. However, exemplary embodiments of the disclosure are not limited thereto. The variable resistor device R may be connected between one of the plurality of bit lines BL0 through BLm and the selection device D, and the selection device D may be connected between the variable resistor device R and one of the plurality of word lines WL0 through WLn.

The variable resistor device R may be switched to one of a plurality of resistive states, in response to an electric pulse applied thereto. In some exemplary embodiments, the variable resistor device R may include a phase-change material having a crystal state that changes according to a current. The phase-change material may include various materials GaSb, InSb, InSe, or $Sb_2Te_3$ obtained by compounding two elements, GeSbTe, GaSeTe, InSbTe, $SnSb_2Te_4$, or InSbGe obtained by compounding three elements, or AgInSbTe, (GeSn)SbTe, GeSb(SeTe), $Te_{81}Ge_{15}Sb_2S_2$ obtained by compounding four elements.

The phase-change material may have an amorphous state that is relatively resistive, and a crystal state that is relatively low-resistive. A phase of the phase-change material may be changed by Joule's heat that is generated by the current. By using the change of the phase, data may be written.

In other exemplary embodiments, the variable resistor device R may not include the phase-change material but may include perovskite compounds, transition metal oxide, magnetic materials, ferromagnetic materials, or antiferromagnetic materials.

Figure 5A:
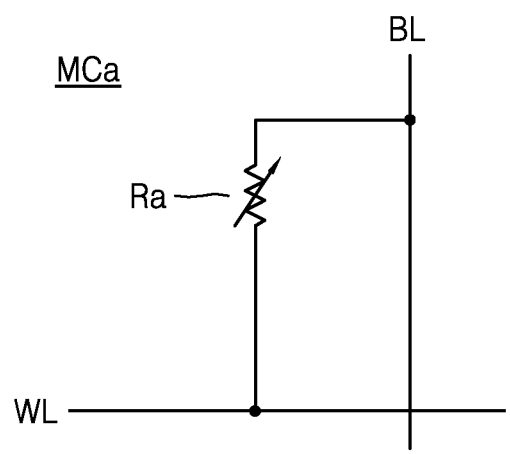
FIGS. 5A through 5C are circuit diagrams illustrating modification examples of a memory cell of FIG. 4.
Figure 5B:
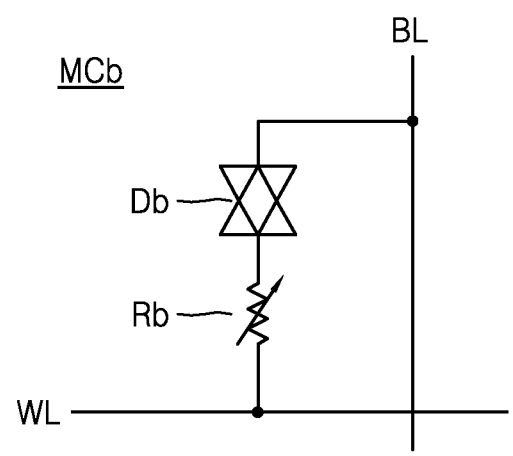
Figure 5C:
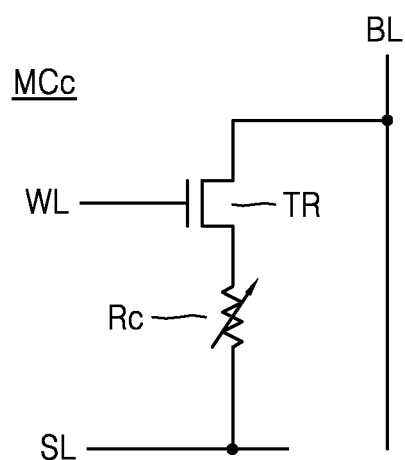

FIGS. 5A through 5C are circuit diagrams illustrating modification examples of the memory cell MC of FIG. 4.

Referring to FIG. 5A, a memory cell MCa may include a variable resistor device Ra that may be connected between a bit line BL and a word line WL. The memory cell MCa may store data due to voltages that are respectively applied to the bit line BL and the word line WL.

Referring to FIG. 5B, a memory cell MCb may include a variable resistor device Rb and a bidirectional diode Db. The variable resistor device Rb may include a resistive material so as to store data. The variable resistor device Rb and the bidirectional diode Db may be connected between a word line WL and a bit line BL. Positions of the bidirectional diode Db and the variable resistor device Rb may be changed with each other. By using the bidirectional diode Db, a leakage current that may flow to a non-selected resistor cell may be blocked.

Referring to FIG. 5C, a memory cell MCc may include a variable resistor device Rc and a transistor TR. The transistor TR may be a selection device that supplies or blocks a current to the variable resistor device Rc according to a voltage of the word line WL, that is, a switching device. According to the embodiment of FIG. 5C, in addition to the word line WL, a source line SL and bit line BL adjust voltage levels at both terminals of the variable resistor device Rc. The memory cell MCc may be selected or not selected according to ON or OFF of the transistor TR that is driven via the word line WL.

Figure 6:
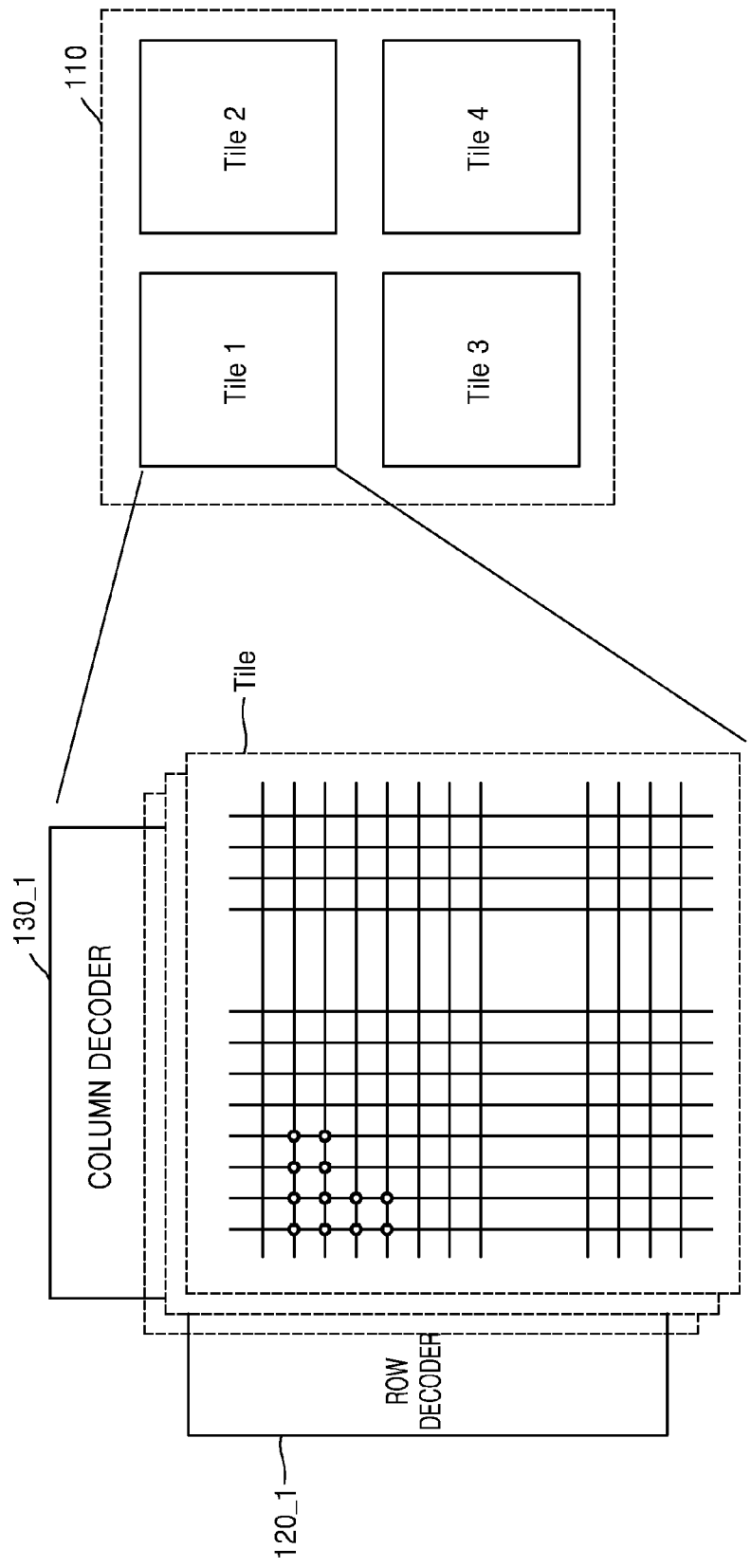
FIG. 6 is a block diagram illustrating a structure of a memory cell array and an arrangement of a row decoder/column decoder of FIG. 2.

FIG. 6 is a block diagram illustrating a structure of the memory cell array 110 and an arrangement of the row decoder 120/column decoder 130 of FIG. 2.

The memory cell array 110 may include a plurality of tiles Tile 1 through Tile 4. The tiles may be defined by using various methods. For example, each tile may include memory cells arranged in a region in which a plurality of word lines and a plurality of bit lines cross each other, wherein the words lines may be a unit that is connected to the same row decoder 120 (or a row switch block 120_1), and the bit lines may be a unit that is connected to the same column decoder 130 (or a column switch block 130_1). Also, write and read operations may be performed based on a tile unit. Accordingly, memory cells included in different tiles may be simultaneously written or simultaneously read. According to the structure illustrated in FIG. 6, the row decoder 120_1 of FIG. 6 may be a configuration which corresponds to a portion of the row decoder 120 of FIG. 2, and the column decoder 130_1 of FIG. 6 may be a configuration which corresponds to a portion of the column decoder 130 of FIG. 2.

Although not illustrated, the memory device 100 of FIG. 2 may have a structure in which a plurality of layers are three-dimensionally stacked in a vertical direction. Accordingly, the memory cell array 110 may include memory cells arranged in the plurality of layers. In this case, each tile may include the memory cells arranged in the plurality of layers, the row decoder 120_1 may be shared by the plurality of layers, and the column decoder 130_1 may be shared by the plurality of layers.

Figure 7:
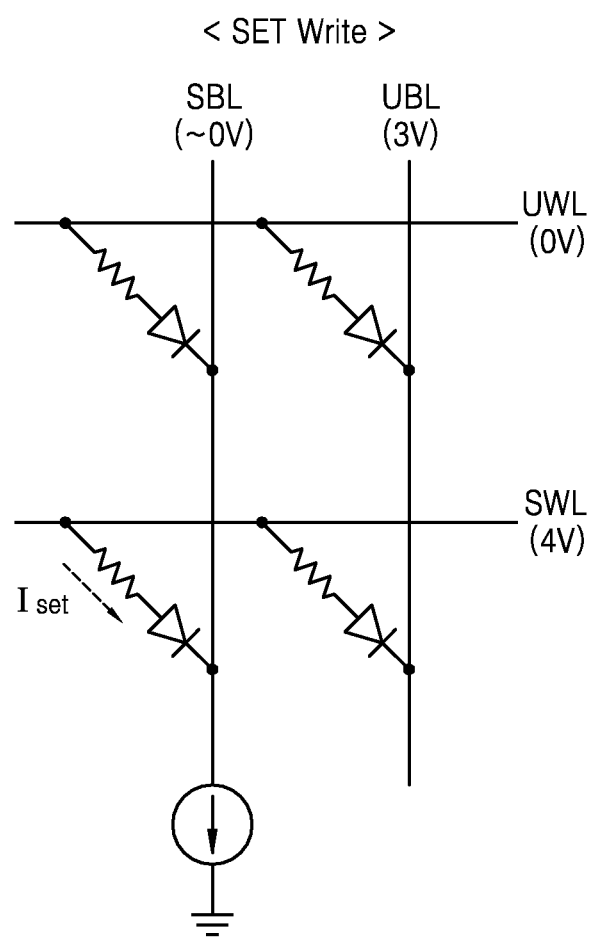
FIGS. 7 through 9 are circuit diagrams illustrating various memory operations of a resistive memory device.
Figure 8:
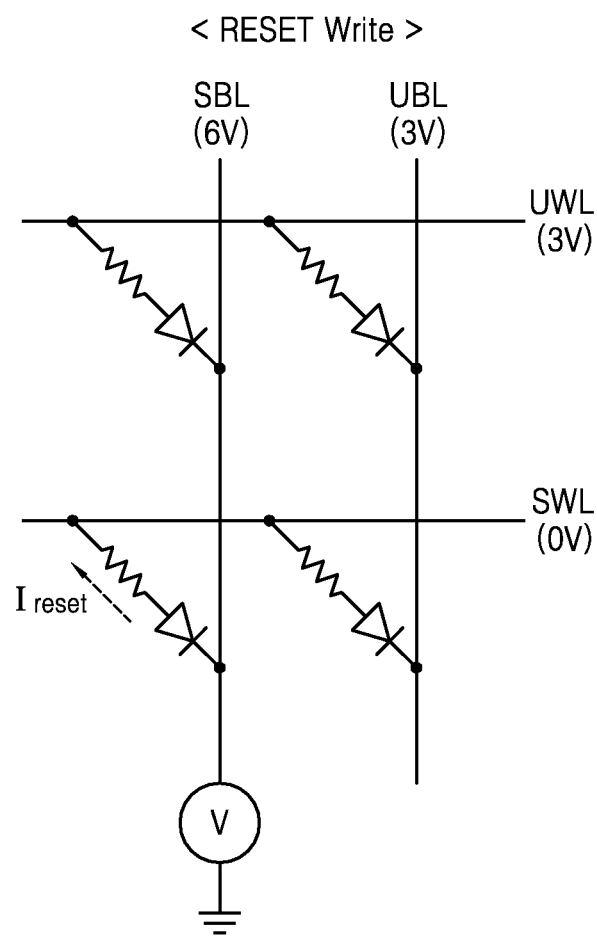
Figure 9:
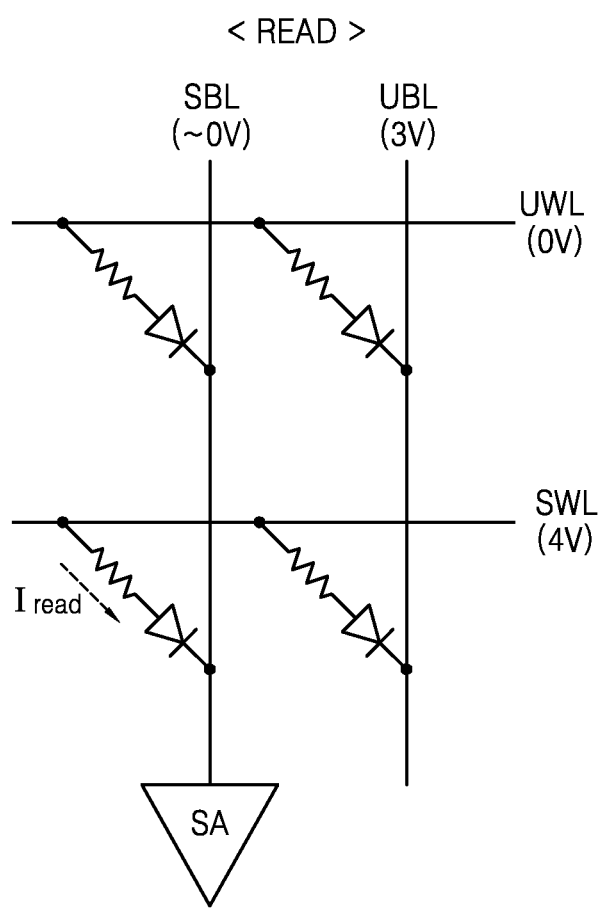

FIGS. 7 through 9 are circuit diagrams illustrating various memory operations of a resistive memory device. FIGS. 7 through 9 illustrate a memory operation according to a bidirectional write operation. For example, FIG. 7 illustrates a set write operation as a write operation, FIG. 8 illustrates a reset write operation as the write operation, and FIG. 9 illustrates a read operation. Also, bit lines illustrated in FIGS. 7 through 9 may be local bit lines. Hereinafter, even though not explicitly stated, the configuration referred to as the bit line may correspond to local bit line.

As illustrated in FIG. 7, in the case of the set write operation, a difference in voltages applied to both ends of a selected memory cell may have a first polarity. For example, if a voltage of 4V is applied to a selection word line SWL and a voltage of 0V is applied to a selection bit line SBL, a voltage of a higher level may be applied to the selection word line SWL than the selection bit line SBL. Also, an inhibit voltage of an appropriate level may be applied to non-selected lines. For example, an inhibit voltage of 3V may be applied to a non-selected bit line UBL and an inhibit voltage of 0V may be applied to a non-selected word line UWL.

According to the above biasing condition, a set current Iset may flow from the selection word line SWL to the selection bit line SBL, and a level of the set current Iset may be adjusted according to a current source connected to the selection bit line SBL. That is, in the case of the set write operation, a resistance value of the variable resistance of the selected memory cell may be adjusted according to a level of a current sinking to the selection bit line SBL.

Meanwhile, as illustrated in FIG. 8, in the case of the reset write operation, a difference in voltages applied to both ends of a selected memory cell may have a second polarity. For example, if a voltage of 0V is applied to a selection word line SWL and a voltage of 6V is applied to a selection bit line SBL, a voltage of a higher level may be applied to the selection bit line SBL than the selection word line SWL. Also, an inhibit voltage of an appropriate level may be applied to non-selected lines. For example, an inhibit voltage of 3V may be applied to a non-selected bit line UBL and an inhibit voltage of 3V may be applied to a non-selected word line UWL.

According to the above biasing condition, a reset current Ireset may flow from the selection bit line SBL to the selection word line SWL, and a level of the reset current Ireset may be adjusted according to a level of the voltage applied to the selection bit line SBL. That is, in the case of the reset write operation, a resistance value of the variable resistance of the selected memory cell may be adjusted according to the level of the voltage applied to the selection bit line SBL.

Meanwhile, as illustrated in FIG. 9, in the case of the read operation, a difference in voltages applied to both ends of a selected memory cell may have a first polarity. For example, if a read voltage Vread of a predetermined level, for example, a read voltage Vread of 4V, is applied to a selection word line SWL and a voltage of 0V is applied to a selection bit line SBL, a voltage of a higher level may be applied to the selection word line SWL than the selection bit line SBL. Also, an inhibit voltage of an appropriate level may be applied to non-selected lines. For example, an inhibit voltage Vinh of a predetermined level, for example, an inhibit voltage of 3V, may be applied to a non-selected bit line UBL and an inhibit voltage of 0V may be applied to a non-selected word line UWL.

According to the above biasing condition, a read current Iread may flow from the selection word line SWL to the selection bit line SBL, and data may be determined according to a sensing operation of a sense amplifier SA connected to the selection bit line SBL.

Figure 10:
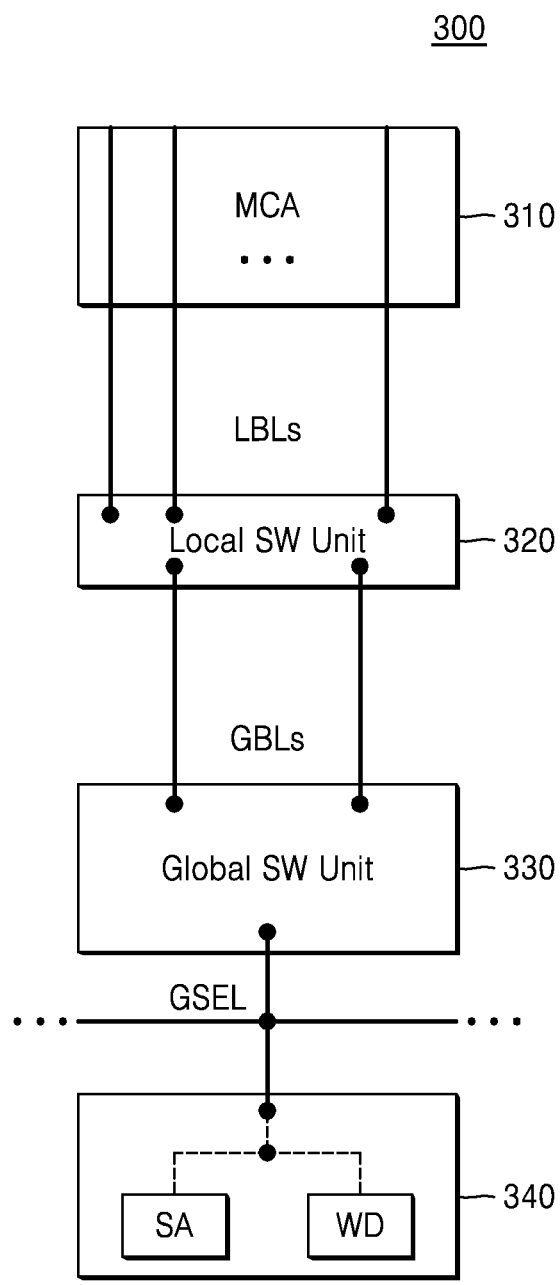
FIG. 10 is a block diagram illustrating a structure of a column decoder according to an exemplary embodiment.
Figure 11:
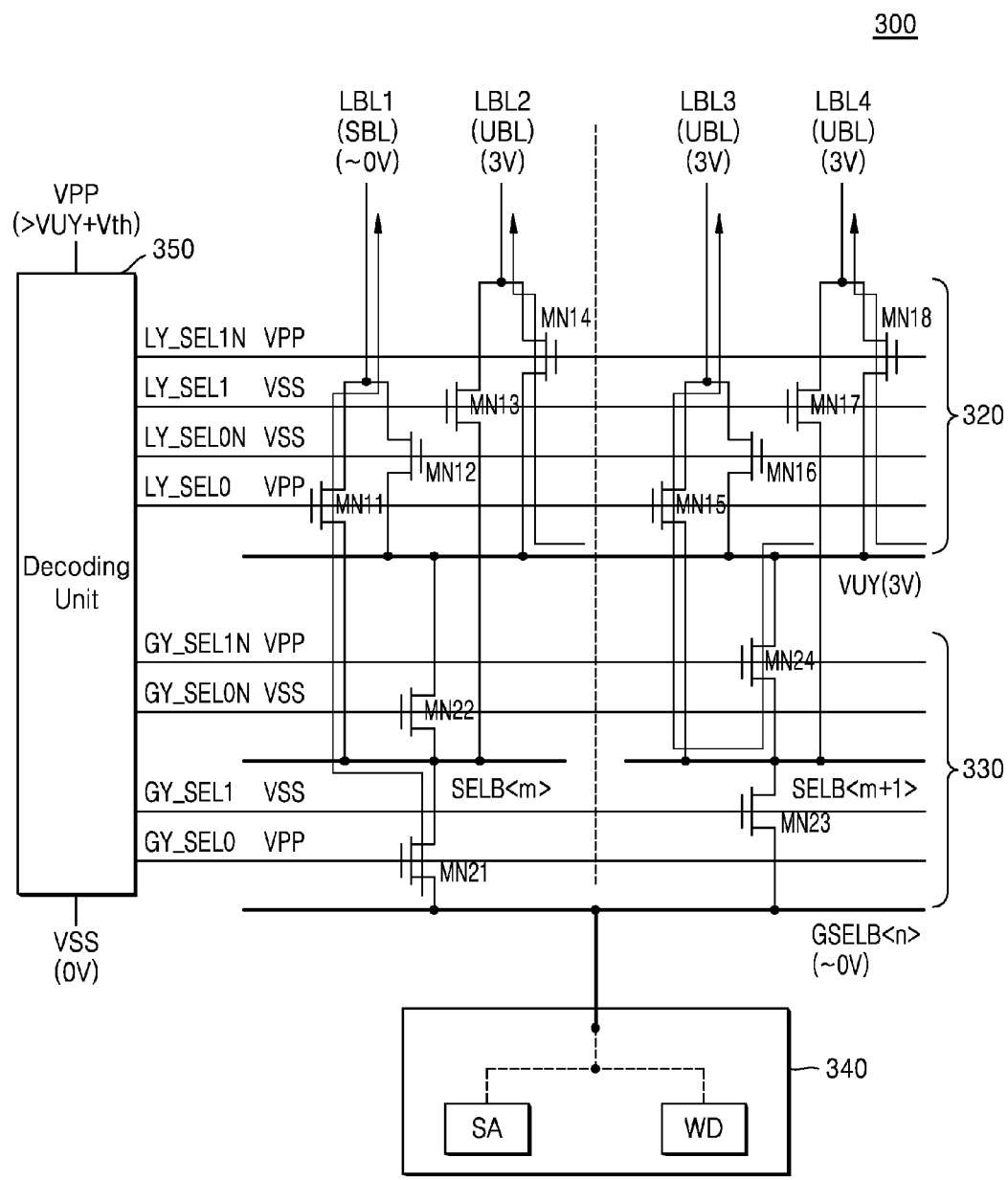
FIG. 11 is a circuit diagram illustrating an example of an operation of the column decoder of FIG. 10.
Figure 12:
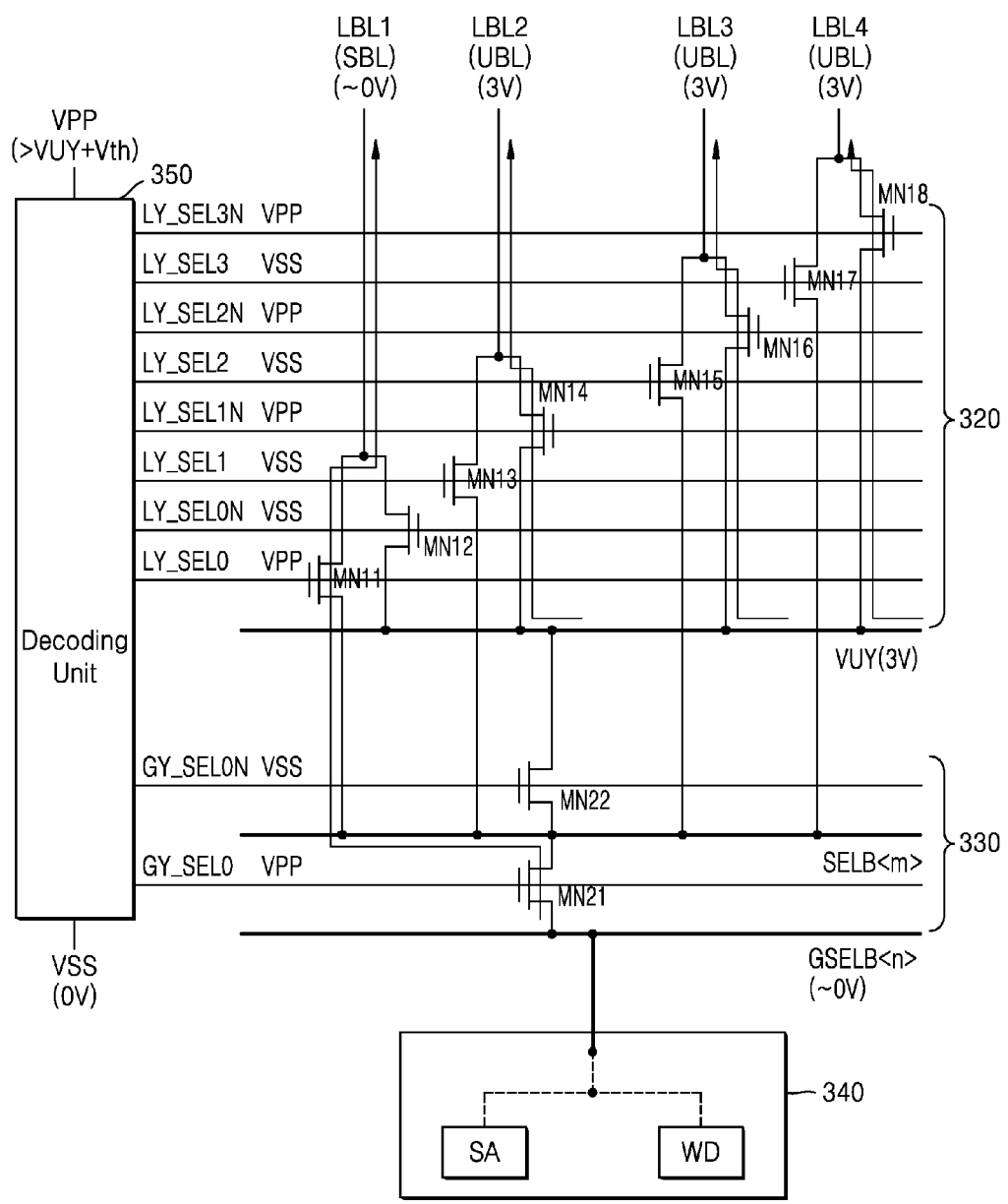
FIG. 12 is a circuit diagram illustrating another example of an operation of the column decoder of FIG. 10.

Hereinafter, an operation of a column decoder of a memory device 300 according to an exemplary embodiment will be described, by referring to FIGS. 10 through 13A and 13B. FIG. 10 is a block diagram illustrating a structure of the column decoder according to the present exemplary embodiment. FIG. 11 is a circuit diagram illustrating an operation of the column decoder of FIG. 10. FIG. 12 is a circuit diagram illustrating another operation of the column decoder of FIG. 10.

Referring to FIGS. 10 through 13A and 13B, the memory device 300 may include a memory cell array 310, a first switch unit 320 and a second switch unit 330, as at least one switch unit included in the column decoder, and a write/read circuit 340. Also, a decoding unit 350 that decodes an address (for example, a column address) may further be included in the memory device 300 and the decoding unit 350 may be included in the column decoder.

The memory cell array 310 may include a plurality of local bit lines LBLs, and the plurality of local bit lines LBLs may be connected to the first switch unit 320. The first switch unit 320 may control a connection between the local bit lines LBLs and global bit lines GBLs. Also, the second switch unit 330 may be arranged between the global bit lines GBLs and the write/read circuit 340. The second switch unit 330 may control a connection between the global bit lines GBLs, and a write driver WD and a sense amplifier SA. The first switch unit 320 may be referred to as a local switch unit Local SW Unit, and the second switch unit 330 may be referred to as a global switch unit Global SW Unit.

With respect to FIG. 11, an example in which switches of the first switch unit 320, which are arranged in correspondence to at least two local bit lines LBLs, share a control signal will be described. For convenience of explanation, first through fourth local bit lines LBL1 through LBL4 and one sense amplifier SA and write driver WD shared by the first through fourth local bit lines LBL1 through LBL4 will be described. Also, it is assumed that the first local bit line LBL1 is a selection bit line and the other local bit lines, namely, the second through fourth local bit lines LBL2 through LBL4, are non-selected bit lines.

The decoding unit 350 may receive various voltage signals VPP and VSS, and may generate various control signals for controlling switches included in the first switch unit 320 and the second switch unit 330 according to a result of decoding. A high voltage VPP may have a greater value than the sum of an inhibit voltage VUY for biasing the non-selected lines and a threshold voltage Vth of a switch (for example, an NMOS transistor) included in the first switch unit 320 and the second switch unit 330.

At least two switches may be arranged in correspondence to one local bit line. For example, a pair of switches may be arranged in correspondence to one local bit line, and a first switch and a second switch of the pair of switches may be transistors of the same type. In some exemplary embodiments, the first and second switches of the pair of switches of the first switch unit 320 may be realized as an NMOS transistor. As illustrated in FIG. 11, a first pair of switches, which are arranged in correspondence to the first local bit line LBL1, may include a first switch MN11 and a second switch MN12. Similarly, a second pair of switches, which are arranged in correspondence to the second local bit line LBL2, may include a first switch MN13 and a second switch MN14. Also, a third pair of switches, which are arranged in correspondence to the third local bit line LBL3, may include a first switch MN15 and a second switch MN16. A fourth pair of switches, which are arranged in correspondence to the fourth local bit line LBL4, may include a first switch MN17 and a second switch MN18.

At least one control signal may be shared according to an arrangement of the switches and lines transferring control signals. For example, a first pair of control signals LY_SEL0 and LY_SEL0N may be shared by the first pair of switches MN11 and MN12 and the third pair of switches MN15 and MN16. Also, a second pair of control signals LY_SEL1 and LY_SEL1N may be shared by the second pair of switches MN13 and MN14 and the fourth pair of switches MN17 and MN18.

Meanwhile, the second switch unit 330 may have a structure in which a pair of switches are arranged in correspondence to at least two local bit lines LBLs. Also, the pair of switches of the second switch unit 330 may also include a first switch and a second switch of the same type, and the first and second switches may be realized as an NMOS transistor. As illustrated in FIG. 11, a first pair of switches MN21 and MN22 of the second switch unit 330 may be arranged in correspondence to the first pair of switches MN11 and MN12 and the second pair of switches MN13 and MN14 of the first switch unit 320. Also, a second pair of switches MN23 and MN24 of the second switch unit 330 may be arranged in correspondence to the third pair of switches MN15 and MN16 and the fourth pair of switches MN17 and MN18 of the first switch unit 320.

Also, at least one line for transferring various voltage signals may be arranged in the column decoder (or the memory device). For example, in the column decoder (or the memory device), a first line GSELB<n>, to which a selection voltage is applied and which transfers the selection voltage, a second line VUY, to which an inhibit voltage is applied and which transfers the inhibit voltage, and a third line SELB<m> and SELB<m+1>, which transfers voltages of various levels according to applied voltages, may be arranged. As for a connection state of the switches of the first switch unit 320 and the second switch unit 330, an end of the first switches MN11, MN13, MN15, and MN17 of the first through fourth pairs of switches of the first switch unit 320 is connected to the third line SELB<m> and SELB<m+1>, and an end of the second switches MN12, MN14, MN16, and MN18 is connected to the second line VUY. Also, the first switches MN21 and M23 of the first and second pairs of switches of the second switch unit 330 may be connected between the first line GSELB<n> and the third line SELB<m> and SELB<m+1>, and the second switches MN22 and MN24 may be connected between the second line VUY and the third line SELB<m> and SELB<m+1>.

An operation of the first and second switch units 320 and 330 will be described as follows, in the case where the first local bit line LBL1 is selected:

When the first local bit line LBL1 is selected, the selection voltage may be provided to the first local bit line LBL1 via the first switch MN11. When the first local bit line LBL1 is not selected, the inhibit voltage may be provided to the first local bit line LBL1 via the first switch MN11 or the second switch MN12, according to the connection state of the switches and the control signals. That is, in the first pair of switches of the first switch unit 320, the first switch MN11 is used as a switch for transferring the selection voltage and the inhibit voltage may be transferred selectively via the first switch MN11 or the second switch MN12.

In the first pair of switches of the second switch unit 330, the first switch MN21 may be used as a switch for transferring the selection voltage and the second switch MN22 may be used as a switch for transferring the inhibit voltage.

The first pair of control signals LY_SEL0 and LY_SEL0N for controlling the first switch unit 320 may have complementary levels, and the second pair of control signals LY_SEL1 and LY_SEL1N may also have complementary levels. Also, a third pair of control signals GY_SEL0 and GY_SEL0N for controlling the second switch unit 330 may have complementary levels and a fourth pair of control signals GY_SEL1 and GY_SEL1N may have complementary levels.

When the first local bit line LBL1 is selected, the switches MN21 and MN11 are turned on so that a selection voltage (for example, 0V) may be provided to the first local bit line LBL1. On the contrary, an inhibit voltage (for example, 3V) may be provided to the non-selected local bit lines UBL according to the operation of the first and second switch units 320 and 330. For example, when the switch MN14 is turned on, an inhibit voltage (for example, 3V) may be provided to the second local bit line LBL2 via the second line VUY and the switch MN14.

The inhibit voltage may also be provided to the other local bit lines LBL3 and LBL4. From among the pair of switches MN23 and MN24 of the second switch unit 330, which are arranged in correspondence to the third and fourth local bit lines LBL3 and LBL4, the switch MN23 related to the transfer of the selection voltage is turned off, while the switch MN24 related to the transfer of the inhibit voltage is turned on. Also, according to the first pair of control signals LY_SEL0 and LY_SEL0N and the second pair of control signals LY_SEL1 and LY_SEL1N, the switches MN15 and MN18 may be turned on and the switches MN16 and MN17 may be turned off.

As for the third local bit line LBL3, the inhibit voltage (3V) transferred via the second line VUY may be provided to the third local bit line LBL3 via the switches MN24 and MN15. Also, as for the fourth local bit line LBL4, the inhibit voltage (3V) transferred via the second line VUY may be provided to the fourth local bit line LBL4 via the switch MN18.

As illustrated in FIG. 11, appropriate biasing with respect to the plurality of local bit lines is possible, while the non-selected local bit lines are not floated. Also, since selection voltages of various levels are applied to the first line GSELB<n> to which the selection voltage is transferred to, the write operation may be performed by bi-directionally driving the memory cells.

Meanwhile, the operation of the present exemplary embodiment described by referring to FIGS. 10 and 11 may be summarized as below. Of one pair of switches of the first switch unit 320, which are arranged in correspondence to one local bit line, one switch (for example, the first switch) may be used for transferring the selection voltage, and the inhibit voltage may be provided to the non-selected local bit line selectively via the first switch or the second switch. Also, of one pair of switches of the second switch unit 330, which are arranged in correspondence to the local bit line group, one switch (for example, the first switch) may be used for transferring the selection voltage and the other switch (for example, the second switch) may be used for transferring the inhibit voltage.

That is, with respect to the local bit line that is selected, the selection voltage may be provided to the selected local bit line by using an exclusive path including the first switch that is used for transferring the selection voltage, from one pair of switches of the second switch unit 330, and the first switch of the first switch unit 320. On the contrary, with respect to the non-selected local bit line, the inhibit voltage may be provided to the non-selected local bit line via different paths, according to the connection state of the switches of the first and second switch units 320 and 330.

Accordingly, with respect to the local bit line LBL1 that is selected, the selection voltage may be applied via the first switch MN21 of the second switch unit 330 and the first switch MN11 of the first switch unit 320.

Also, with respect to the non-selected local bit line, the inhibit voltage may be applied via the second switch MN14 or MN18 of the first switch unit 320.

Also, with respect to the non-selected local bit line, the first switch (for example, MN15 of FIG. 11) of the pair of switches of the first switch unit 320, which are arranged in correspondence to the non-selected local bit line, may be turned on, since the pair of switches of the first switch unit 320 share a control signal with a pair of switches connected to a selected local bit line. However, since the second switch (MN24 of FIG. 11) of the corresponding pair of switches of the second switch unit 330 is turned on, the inhibit voltage (3V) may be provided to the non-selected local bit line via the switches MN24 and MN15.

Meanwhile, FIG. 12 illustrates an example in which the pairs of switches of the first switch unit 320, which are arranged in correspondence to the plurality of local bit lines, are switched according to separate control signals. More specifically, FIG. 12 illustrates an example in which one pair of switches MN21 and MN22 of the second switch unit 330 are arranged in correspondence to the first through fourth local bit lines LBL1 through LBL4. Accordingly, the third pair of switches MN15 and MN16 of the first switch unit 320 may be controlled by the third pair of control signals LY_SEL2 and LY_SEL2N, and the fourth pair of switches MN17 and MN18 of the first switch unit 320 may be controlled by the fourth pair of control signals LY_SEL3 and LY_SEL3N.

As illustrated in FIG. 12, when any local bit line LBL1 from among the first through fourth local bit lines LBL1 through LBL4 is selected to correspond to the pair of switches MN21 and MN22 of the second switch unit 330, the switch MN21 of the pair of switches MN21 and MN22 of the second switch unit 330 is turned on, and the other switch MN22 is turned off. Also, in the case of the first pair of switches MN11 and MN12 of the first switch unit 320, corresponding to the first local bit line LBL1, the first switch MN 11 is turned on, while in the case of the other pairs of switches of the first switch unit 320, the second switches MN14, MN16, and MN18 are turned on.

According to the connection relations above, the selection voltage is provided to the selected local bit line LBL1 via the first line GSELB<n>, the switch MN21, and the switch MN11. On the contrary, with respect to the other non-selected local bit lines LBL2 through LBL4, the inhibit voltage is provided via the second line VUY and the switches MN14, MN16, and MN18.

Figure 13B:
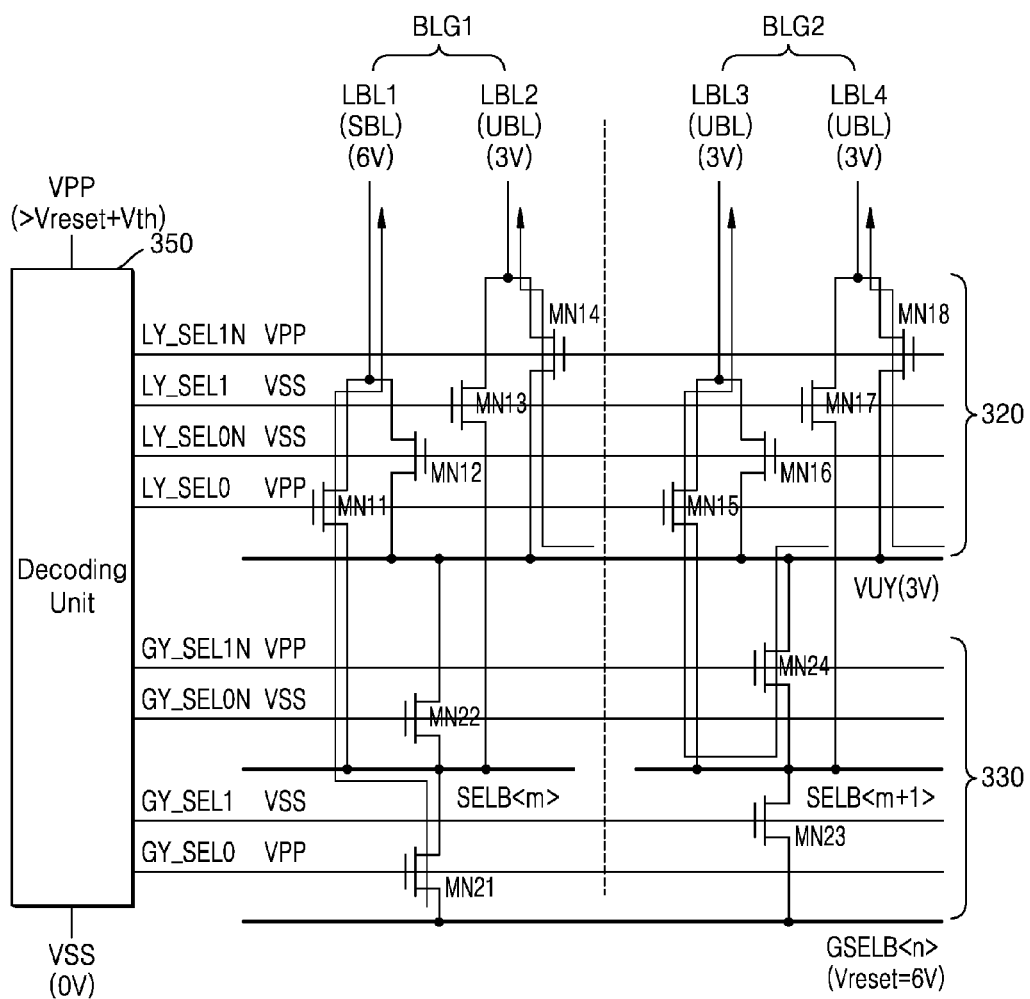

FIGS. 13A and 13B are circuit diagrams illustrating a bidirectional operation of the memory device 300 including the column decoder, illustrated FIG. 11. FIG. 13A illustrates a set write (or a read) operation according to a first polarity, and FIG. 13B illustrates a reset write operation according to a second polarity. In the description of the operation of the memory device 300 of FIGS. 13A and 13B, the same configurations as the configurations illustrated in FIGS. 10 through 12 perform the same operations as the operations of the configurations illustrated in FIGS. 10 through 12, and thus, their detailed descriptions are omitted.

As illustrated in FIG. 13A, in the set write (or the read) operation, the selection voltage applied to the selection word line SWL may have a relatively great value (for example, 4V). On the contrary, the selection voltage of 0V may be applied to the selection bit line SBL. In FIGS. 13A and 13B, it is assumed that the first local bit line LBL1 is the selection bit line SBL. Also, as illustrated in FIG. 13B, in the reset write operation, the selection voltage of a relatively great value of about 6V may be applied to the selection bit line SBL.

When the first local bit line LBL1 is selected, the first switch MN21 of the first pair of switches MN21 and MN22 of the second switch unit 330, corresponding to the first bit line group BLG1 including the first local bit line LBL1, is turned on, and the second switch MN22 is turned off. On the contrary, the first switch MN23 of the second pair of switches MN23 and MN24 of the second switch unit 330, corresponding to the other bit line groups (for example, the second bit line group BLG2), is turned off, and the second switch MN24 is turned on.

Also, the first switch MN11 of the first pair of switches MN11 and MN12 of the first switch unit 320, corresponding to the first local bit line LBL1, is turned on, and the second switch MN12 is turned off. Also, the first switch MN15 of the third pair of switches MN15 and MN16, which share the control signals LY_SEL0 and LY_SEL0N with the first pair of switches MN11 and MN12, is turned on, and the second switch MN16 is turned off. Also, with respect to pairs of switches corresponding to the remaining non-selected local bit lines, the first switches MN13 and MN17 of the pairs of switches corresponding to the other non-selected local bit lines are turned off and the second switches MN14 and MN18 are turned on.

According to the switching connection state above, the selection voltage is applied to the selected local bit line LBL1 and the inhibit voltage may be appropriately applied to the other non-selected local bit lines LBL2 through LBL4. Also, the switches may be controlled so that bidirectional writing is possible, as illustrated in FIGS. 13A and 13B.

Meanwhile, since the writing and reading operations are performed according to bidirectional driving, as illustrated in FIGS. 13A and 13B, the selection voltage of a relatively low level of 0V or the selection voltage of a relatively high level of 6V may be applied to the selected first local bit line LBL1. Here, when the selection voltage of the relatively high level of 6V is transferred via the first switch MN11 realized as an NMOS transistor, the voltage that is actually provided to the selected first local bit line LBL1 may have a lower value than 6V due to voltage drop characteristics due to a threshold voltage of the NMOS transistor. Accordingly, in the bidirectional driving, when the selection voltage of a relatively high level is applied, the selection voltage generated by the power generator may be adjusted to be high.

Meanwhile, although voltages of specific levels applied to the selected local bit line SLB and the non-selected local bit lines are illustrated in FIGS. 11 through FIGS. 13A and 13B, exemplary embodiments of the present disclosure are not limited thereto, and the voltages may differ.

Figure 14:
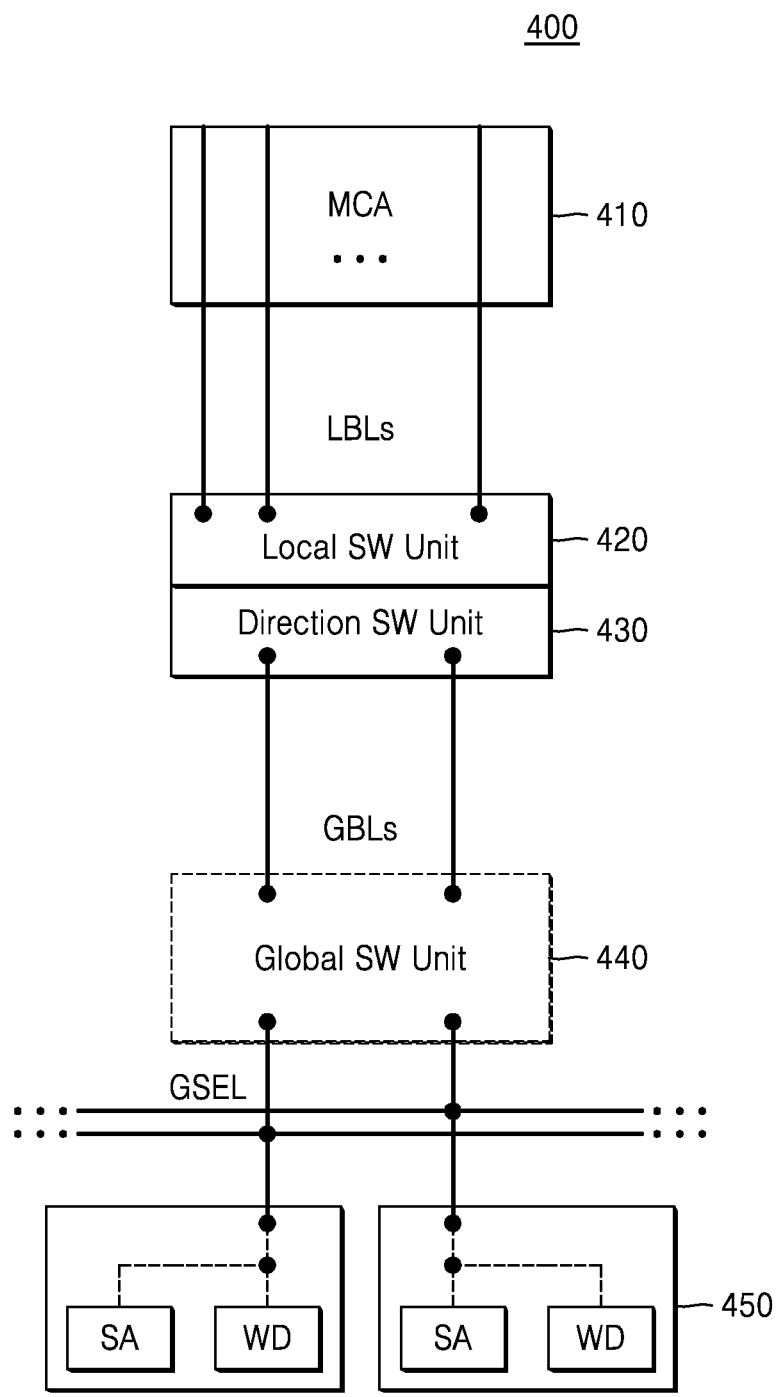
FIGS. 14 and 15 are respectively a block diagram and a circuit diagram illustrating a structure of a column decoder according to another exemplary embodiment.
Figure 15:
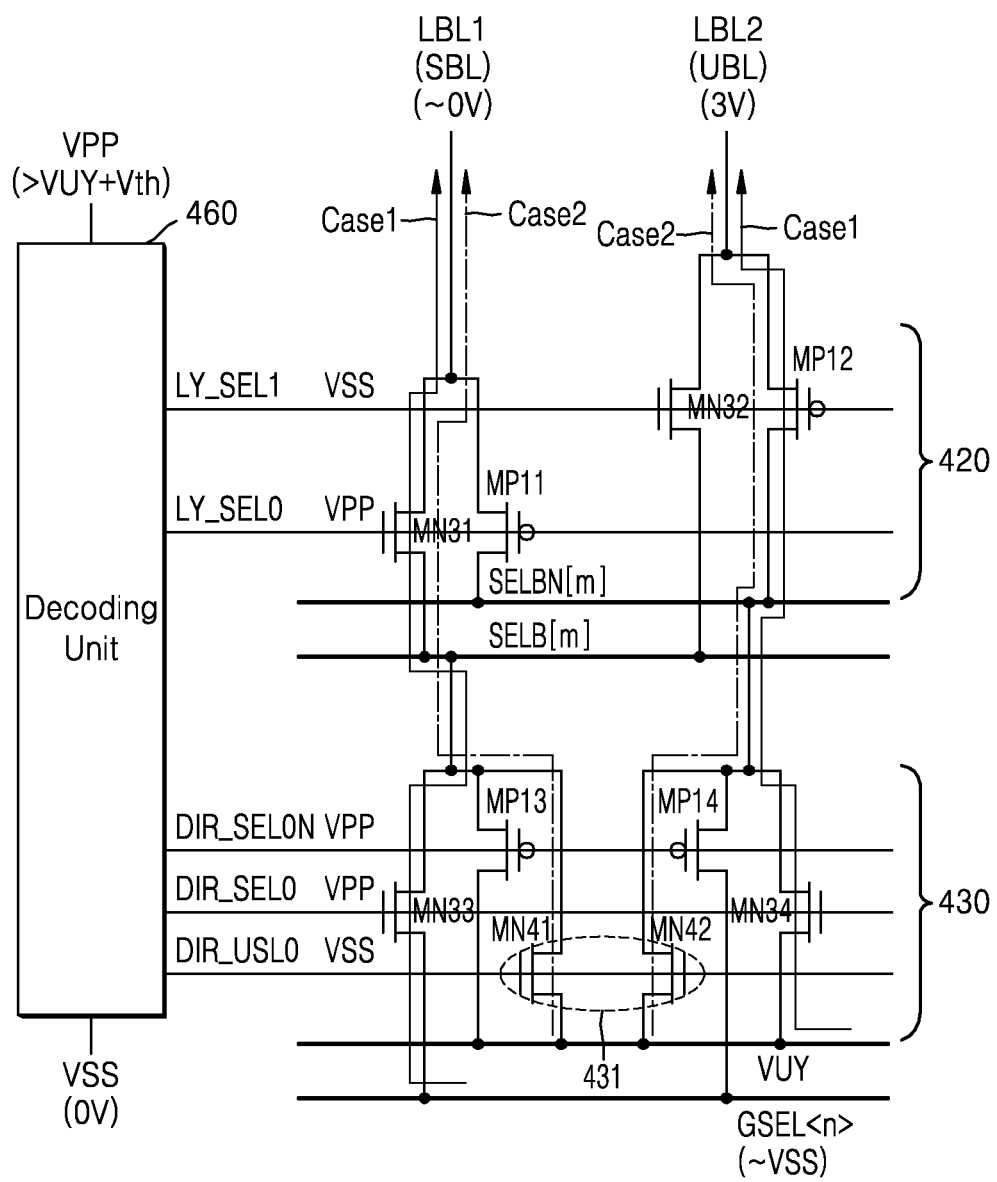

FIGS. 14 and 15 are respectively a block diagram and a circuit diagram illustrating a structure of a column decoder according to another exemplary embodiment.

As illustrated in FIGS. 14 and 15, a memory device 400 may include a memory cell array 410, a first switch unit 420, a second switch unit 430, and a third switch unit 440, as at least one switch unit included in the column decoder, and a write/read circuit 450. Also, a decoding unit 460 decoding an address (for example, a column address) may further be included in the memory device 400, and the decoding unit 460 may be included in the column decoder.

In the exemplary embodiment of FIGS. 14 and 15, the first switch unit 420 connected to the local bit lines LBLs may be referred to as a local switch unit Local SW Unit, and the second switch unit 430 switching various voltage signals for bidirectional driving with respect to the memory cells may be referred to as a direction switch unit Direction SW Unit. Meanwhile, since the third switch unit 440 corresponds to a global switch unit Global SW Unit, the third switch unit 440 may be arranged to control connection relations between the global bit lines GBLs and the write/read circuit 450. In the exemplary embodiment of FIGS. 14 and 15, the third switch unit 440 may or may not be included in the memory device 400. Accordingly, in FIG. 14, the third switch unit 440 is illustrated with a dashed line. When the third switch unit 440 is included in the memory device 400, the operation of the third switch unit 440 is substantially the same as the operation of the global switch unit Global SW Unit illustrated in FIGS. 11 through FIGS. 13A and 13B, and thus, its description is omitted.

An example of the structure and operation of the column decoder according to the present exemplary embodiment will be described below. For convenience of explanation, FIG. 15 illustrates two local bit lines LBL1 and LBL2. Also, it is assumed that the first local bit line LBL1 is the selection bit line SBL and the second local bit line LBL2 is the non-selected bit line UBL.

The first switch unit 420 may include a pair of switches arranged in correspondence to each of the local bit lines. For example, the pair of switches may include switches having a CMOS structure. A first pair of switches are arranged in correspondence to the first local bit line LBL1, and the first pair of switches may include a first switch MN31 realized as an NMOS transistor and a second switch MP11 realized as a PMOS transistor. Also, a second pair of switches arranged in correspondence to the second local bit line LBL2 and may include a first switch MN32 realized as an NMOS transistor and a second switch MP12 realized as a PMOS transistor. Each of the first and second pairs of switches may be controlled complementarily. For example, the first pair of switches MN31 and MP11 may be controlled by the first local control signal LY_SEL0 and the second pair of switches MN32 and MP12 may be controlled by the second local control signal LY_SEL1.

Meanwhile, the memory device 400 may include a plurality of lines for transferring various voltage signals. For example, the first line GSEL<n> for transferring the selection voltage, the second line VUY for transferring the inhibit voltage, as well as the third line SELB[m] and the fourth line SELBN[m] as at least one line for transferring voltages of various levels according to applied voltages, may further be arranged.

Of the pairs of switches of the first switch unit 420, one switch may be connected to the third line SELB[m], and the other switch may be connected to the fourth line SELBN[m]. For example, the first switch MN31 of the first pair of switches MN31 and MP11 may be connected to the third line SELB[m] and the second switch MP11 may be connected to the fourth line SELBN[m]. Also, the first switch MN32 of the second pair of switches MN32 and MP12 may be connected to the third line SELB[m] and the second switch MP12 may be connected to the fourth line SELBN[m].

Meanwhile, the second switch unit 430 may include a plurality of pairs of switches. For example, the second switch unit 430 may include two pairs of switches in correspondence to a plurality of pairs of switches of the first switch unit 420. FIG. 15 illustrates that the second switch unit 430 includes two pairs of switches in correspondence to two pairs of switches of the first switch unit 420. However, the second switch unit 430 may include two pairs of switches in correspondence to more pairs of switches of the first switch unit 420.

Each of the pairs of switches included in the second switch unit 430 may include switches having a CMOS structure. For example, a first pair of switches MN33 and MP13 of the second switch unit 430 may be connected to the third line SELB[m] and a second pair of switches MN34 and MP14 of the second switch unit 430 may be connected to the fourth line SELBN[m]. Each of the first pair of switches MN33 and MP13 and the second pair of switches MN34 and MP14 of the second switch unit 430 may be controlled in response to direction control signals DIR_SEL0 and DIR_SEL0N.

In the exemplary embodiment of FIG. 15, when bidirectional driving of the memory cells is performed, the selection voltage may be controlled to be transferred by passing through an NMOS transistor, if the selection voltage of a relatively low level is provided to the selected local bit line LBL1. On the contrary, if the selection voltage of a relatively high level is provided to the selected local bit line LBL1, the selection voltage may be controlled to be transferred by passing through a PMOS transistor, in order to reduce a voltage drop via the switches. That is, based on the switching operation of the second switch unit 430, the selection voltage of a lower level (for example, 0V) may be applied to the third line SELB[m] via the switch MN33 and the selection voltage may be provided to the selected local bit line LBL1 via the third line SELB[m] and the switch MN31. On the contrary, the selection voltage of a higher level (for example, 6V) may be applied to the fourth line SELBN[m] via the switch MP14 and the selection voltage may be provided to the selected local bit line LBL1 via the fourth line SELBN[m] and the switch MP11.

According to the operation of the first and second switch units 420 and 430, the bidirectional driving with respect to the memory cells may be appropriately performed. As described above, since the selection voltage of a higher level is provided to the selected local bit line LBL1 by only passing through a PMOS transistor, the voltage drop may be minimized.

Meanwhile, the second switch unit 430 may further include a biasing switch unit 431. The biasing switch unit 431 may include one or more switches. For example, the biasing switch unit 430 may include one switch that is arranged in correspondence to one local bit line. Also, the biasing switch unit 431 may be realized as a PMOS transistor or an NMOS transistor. FIG. 15 illustrates an example in which the biasing switch unit 431 includes an NMOS transistor. A first switch MN41 included in the biasing switch unit 431 may be connected between any one of the first pair of switches MN31 and MP11 of the first switch unit 420 and the second line VUY transferring the inhibit voltage, and the second switch MN42 included in the biasing switch unit 431 may be connected between any one of the second pair of switches MN32 and MP12 of the first switch unit 420 and the second line VUY transferring the inhibit voltage.

When a plurality of memory cells arranged in correspondence to the local bit lines LBL1 and LBL2 illustrated in FIG. 15 are assumed to be one cell region, the first line GSEL<n> transferring the selection voltage is electrically connected to a sense amplifier or a write driver (not shown), for a writing or reading operation with respect to the selected local bit line LBL1. Also, according to the switching operation of the first and second switch units 420 and 430 for driving the cell region including selected memory cells, the selection voltage is provided to the selected local bit line LBL1 via the switches MN33 and MN31, and the inhibit voltage is provided to the non-selected local bit line LBL2 via the switches MN34 and MP12. In this case, the switches MN41 and MN42 included in the biasing switch unit 431 may be turned off by a biasing control signal DIR_USL0. That is, according to Case 1 illustrated in FIG. 15, the selection voltage is provided to the selected local bit line LBL1 and the inhibit voltage is provided to the non-selected local bit line LBL2.

On the contrary, when the cell region that is arranged in correspondence to the local bit lines LBL1 and LBL2 is not selected, the first line GSEL<n> transferring the selection voltage may be electrically separated from the sense amplifier or the write driver. Also, the first pair of switches MN33 and MP13 and the second pair of switches MN34 and MP14 of the second switch unit 430 may be turned off in response to the direction control signals DIR_SEL0 and DIR_SEL0N. According to the connection state above, the non-selected local bit lines LBL1 and LBL2 may become floated.

However, according to the present exemplary embodiment, when the cell region is not selected, the switches MN41 and MN42 included in the biasing switch unit 431 may be turned on by the biasing control signal DIR_USL0. Accordingly, the inhibit voltage may be provided to the first local bit line LBL1 via the switches MN41 and MN31, and the inhibit voltage may be provided to the second local bit line LBL2 via the switches MN42 and MP12. Accordingly, the local bit lines of the cell region that is not selected may be prevented from being floated. That is, according to Case 2 illustrated in FIG. 15, the inhibit voltage may be provided to the non-selected local bit lines LBL1 and LBL2 by using the switches MN41 and MN42 included in the biasing switch unit 431.

In other words, according to the present exemplary embodiment, the switches MN41 and MN42 included in the biasing switch unit 431 may be controlled by the additional control signal DIR_USL0, regardless of the switches of the second switch unit 430, which are related to the bidirectional driving. Also, according to the switches MN41 and MN42 included in the biasing switch unit 431, an additional path for transferring the inhibit voltage may be formed. Accordingly, the inhibit voltage may be easily transferred to the non-selected local bit lines.

Figure 16:
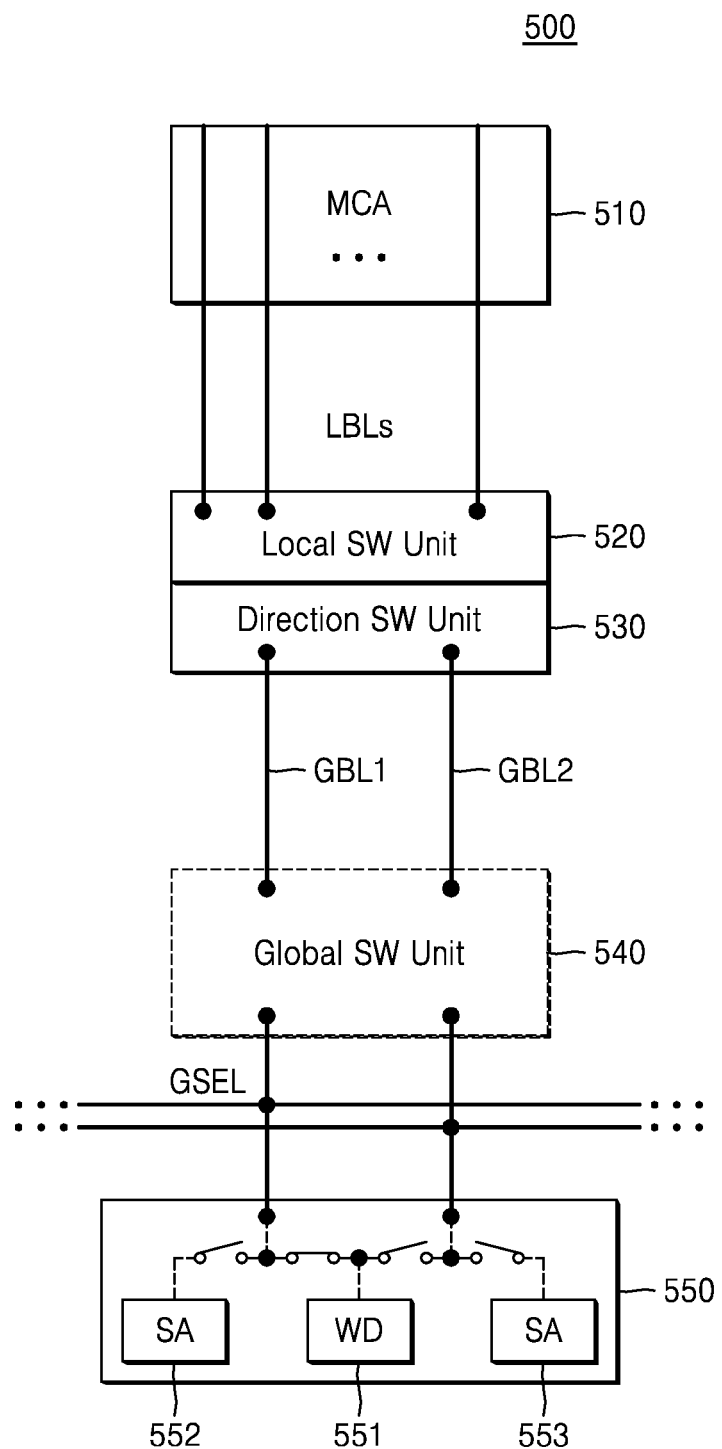
FIG. 16 is a block diagram and FIGS. 17 and 18 are circuit diagrams illustrating a structure of a column decoder according to another exemplary embodiment.
Figure 17:
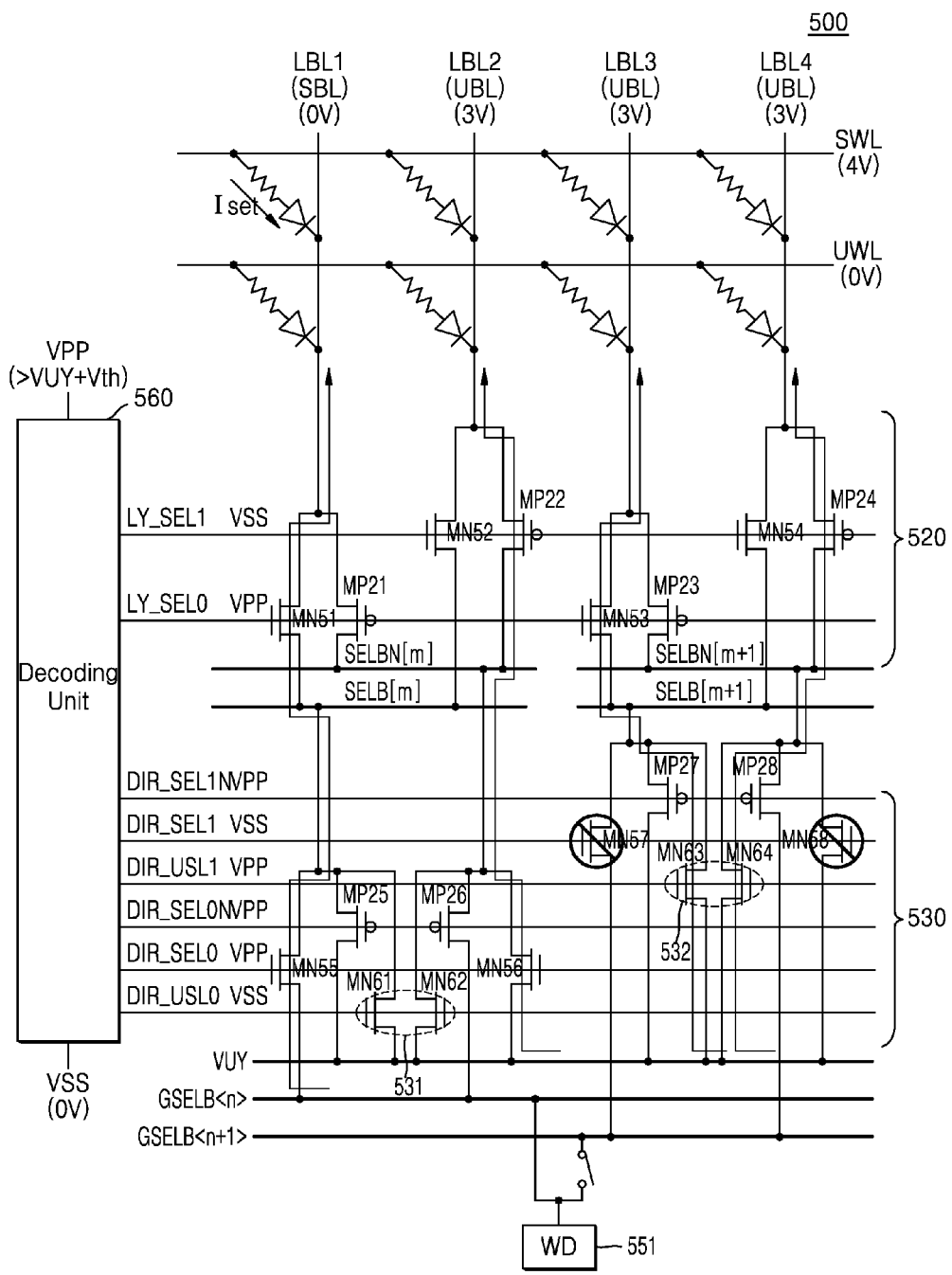
Figure 18:
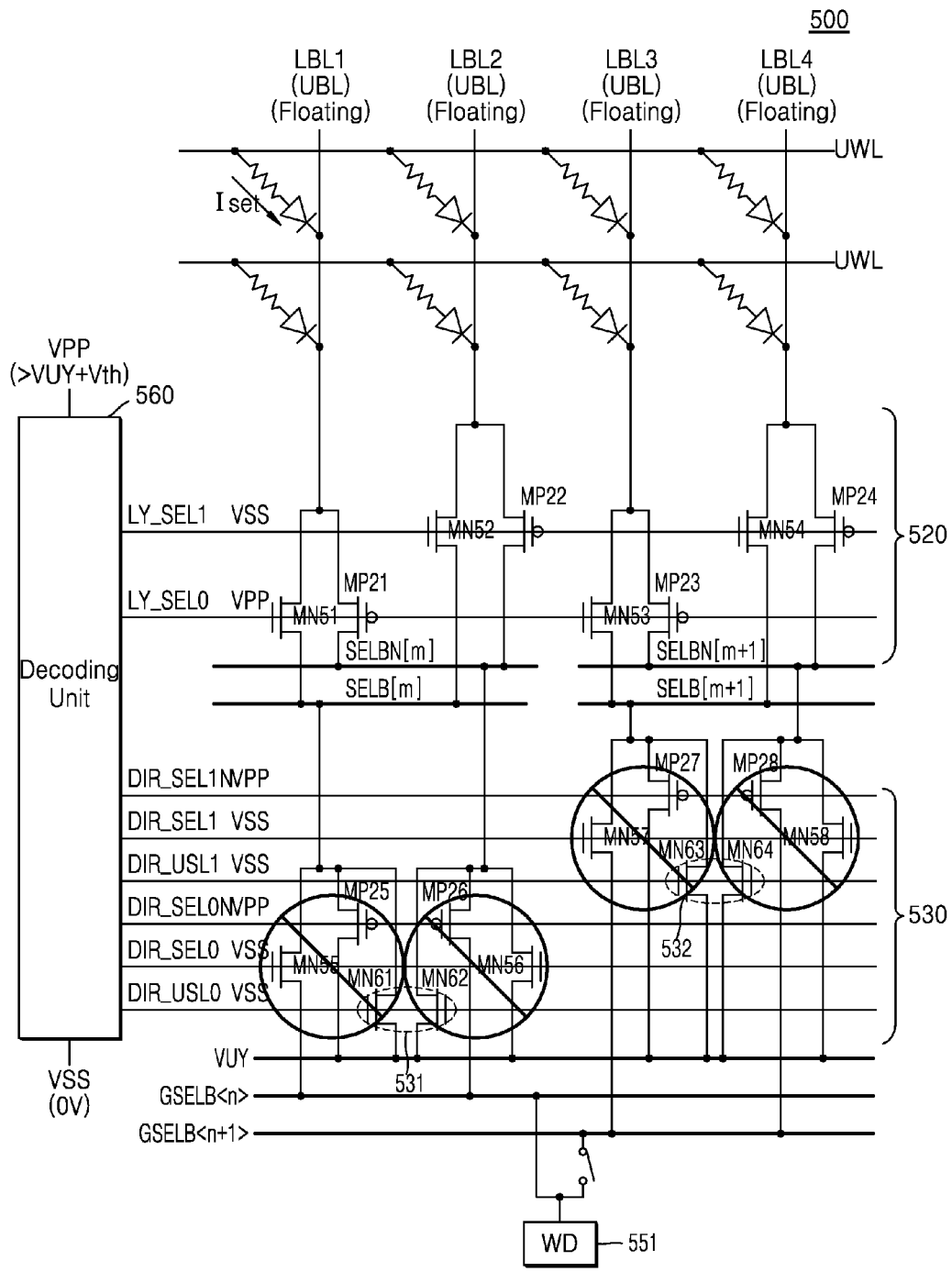

FIG. 16 is a block diagram and FIGS. 17 and 18 are circuit diagrams illustrating a structure of a column decoder according to another exemplary embodiment. The structure and operation illustrated in the exemplary embodiment of FIGS. 16 through 18 are similar to the structure and operation illustrated in the exemplary embodiment of FIGS. 14 and 15. However, FIGS. 16 through 18 illustrate an example in which at least one of a write driver and a sense amplifier is shared by a plurality of global bit lines. In the description of the structure and operation of the exemplary embodiment of FIGS. 16 and 18, the structure and operation of the exemplary embodiment of FIGS. 16 through 18, which are the same as or similar to the structure and operation of the exemplary embodiment of FIGS. 14 and 15 will not be described in detail.

As illustrated in FIG. 16, a memory device 500 may include a memory cell array 510, a first switch unit 520, a second switch unit 530, and a third switch unit 540, as at least one switch unit included in the column decoder, and a write/read circuit 550. Also, a decoding unit 560 decoding an address (for example, a column address) may further be included. The decoding unit 560 may be included in the column decoder. Also, as in the above-described exemplary embodiment, the first switch unit 520 may be referred to as a local switch unit Local SW Unit, and the second switch unit 530 may be referred to as a direction switch unit Direction SW Unit. Also, the third switch unit 540 may or may not be included in the memory device 500.

According to a switching operation of the first switch unit 520 and the second switch unit 530, any one of a plurality of global bit lines GBL may be electrically connected to a plurality of local bit lines LBLs. For example, a first global bit line GBL1 may be electrically connected to a local bit line group, and a second global bit line GBL2 may be electrically connected to another local bit line group. At least one line GSEL transferring the selection voltage may be arranged, and the first and second global bit lines GBL1 and GBL2 may be connected to different lines GSEL.

Meanwhile, the write/read circuit 550 may include a plurality of write drivers WD and sense amplifiers SA. Also, according to an arrangement structure of the write drivers WD and the sense amplifiers SA, any write driver WD or any sense amplifier SA may be selectively connected to two or more global bit lines. In the example of FIG. 16, a first sense amplifier 552 may be connected to the first global bit line GBL1 and a second sense amplifier 553 may be connected to the second global bit line GBL2. Also, a write driver 551 may be selectively connected to the first global bit line GBL1 or the second global bit line GBL2.

A detailed operation of the memory device 500 of FIG. 16 will be described below by referring to FIG. 17. In the present exemplary embodiment, it is assumed that any one (for example, LBL1) is selected from among the local bit lines electrically connected to the first global bit line GBL1, and the other local bit lines LBL2 through LBL4 are not selected. Also, the plurality of local bit lines LBL1 through LBL4 may be divided into at least two bit line groups, for example, first and second bit line groups BLG1 and BLG2.

The selection voltage is applied to the line GSELB<n> corresponding to the first bit line group BLG1, from the write driver 551, and switches included in the first switch unit 520 and the second switch unit 530 are controlled to be turned on or off according to various control signals from the decoding unit 560. The selection voltage applied to the line GSELB<n> is provided to the first local bit line LBL1 via switches MN55 and MN51.

Meanwhile, the inhibit voltage may be applied to the second local bit line LBL2, which is another local bit line included in the first bit line group BLG1 and which is not selected. For example, the inhibit voltage is transferred via the line VUY and the inhibit voltage is provided to the second local bit line LBL2 via switches MN56 and MP22. A first biasing switch unit 531 arranged in correspondence to the first bit line group BLG1 may include a plurality of switches MN61 and MN62, and the switches MN61 and MN62 of the first biasing switch unit 531 may be turned off.

Meanwhile, all of the local bit lines included in bit line groups (for example, the second bit line group BLG2) other than the first bit line group BLG1, for example, the local bit lines LBL3 and LBL4, may not be selected. Also, a line GSELB<n+1> for providing the selection voltage to the local bit lines LBL3 and LBL4 of the second bit line group BLG2 may be electrically separated from the write driver 551. Also, all direction switches MN57, MP27, MN58, and MP28 included in the second switch unit 530 and arranged in correspondence to the second bit line group BLG2 may be turned off.

In order to prevent the local bit lines LBL3 and LBL4 of the second bit line group BLG2 from being floated, switches MN63 and MN64 of a second biasing switch unit 532 arranged in correspondence to the second bit line group BLG2 may be turned on. The switches MN63 and MN64 are connected between the line VUY transferring the inhibit voltage and the first switch unit 520. Accordingly, the inhibit voltage is provided to the third local bit line LBL3 via the switch MN63, the line SELB<m+1>, and a switch MN53. Also, the inhibit voltage is provided to the fourth local bit line LBL4 via the switch MN64, a line SELBN<m+1>, and a switch MP24.

Meanwhile, FIG. 18 illustrates an example in which all of the local bit lines LBL1 through LBL4 are floated since the cell region in which the local bit lines LBL1 through LBL4 are included is not selected. In the structure of the column decoder according to the present exemplary embodiment, the column decoder may be controlled such that appropriate biasing may be performed with respect to non-selected local bit lines. Also, the column decoder may be controlled such that all local bit lines in the non-selected cell region are floated.

Meanwhile, FIG. 18 illustrates an operation in which memory cells arranged in correspondence to the first through fourth local bit lines LBL1 through LBL4 are included in one tile, and when the tile, in which the memory cells are included, is not selected, the local bit lines LBL1 through LBL4 of the tile are floated. As illustrated in FIG. 18, one switch of a pair of switches of the first switch unit 520, the pair of switches being arranged in correspondence to each of the local bit lines LBL1 through LBL4, may be turned on. For example, when the control signal LY_SEL0 has a VPP value, the switches MN51 and MN53 realized as NMOS transistors, from among the switches connected thereto, may be turned on. Also, when the control signal LY_SEL1 has a VSS value, the switches MP22 and MP24 realized as a PMOS transistor, from among the switches connected thereto, may be turned on.

On the contrary, various direction switches of the switches included in the second switch unit 530 may be turned off. Also, the first and second biasing switch units 531 and 532 included in the second switch unit 530 may be turned off in response to the biasing control signals DIR_USL0 and DIR_USL1. When all of the switches of the first and second biasing switch units 531 and 532 are turned off, all of the local bit lines LBL1 through LBL4 may be floated.

Figure 19:
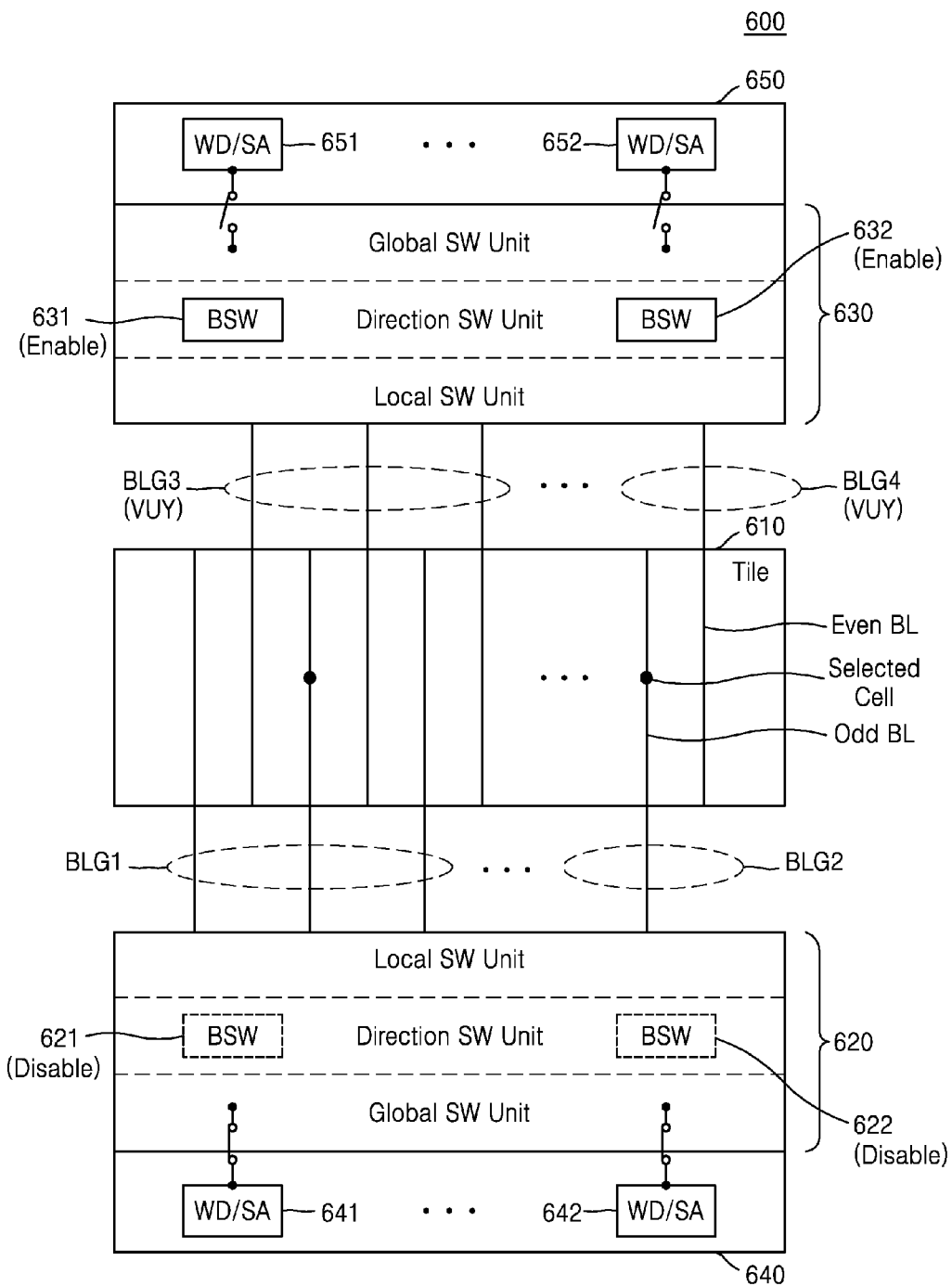
FIG. 19 is a block diagram illustrating a configuration and operation of a memory device according to another exemplary embodiment.

FIG. 19 is a block diagram illustrating an embodiment and operation of a memory device 600 according to another exemplary embodiment. FIG. 19 illustrates that one cell region (for example, a tile) is driven by two column decoders.

A memory cell array 610 of the memory device 600 may include memory cells connected to a plurality of local bit lines, and the plurality of local bit lines may be divided into at least two bit line groups. For example, the plurality of local bit lines may include odd bit lines Odd BL and even bit lines Even BL.

First and second column decoders 620 and 630 may be arranged in correspondence to the memory cell array 610. According to the present exemplary embodiment, the first column decoder 620 may include a local switch unit, a direction switch unit, and a global switch unit. Also, the direction switch unit of the first column decoder 620 may include at least one biasing switch unit 621 or 622. Also, the second column decoder 630 may include a local switch unit, a direction switch unit, and a global switch unit. Also, the direction switch unit of the second column decoder 630 may include at least one biasing switch unit 631 or 632.

Also, a first write/read circuit 640 and a second write/read circuit 650 may be arranged in correspondence to the memory cell array 610. The first write/read circuit 640 may include one or more write drivers/sense amplifiers, for example, first and second write drivers/sense amplifiers 641 and 642. Similarly, the second write/read circuit 650 may include one or more write drivers/sense amplifiers, for example, first and second write drivers/sense amplifiers 651 and 652.

One write driver/sense amplifier may be arranged in correspondence to one or more local bit lines. For example, the first write driver/sense amplifier 641 of the first write/read circuit 640 may correspond to the first local bit line group BLG1, and the second write driver/sense amplifier 642 of the first write/read circuit 640 may correspond to the second local bit line group BLG2. Also, the first write driver/sense amplifier 651 of the second write/read circuit 650 may correspond to the third local bit line group BLG 3, and the second write driver/sense amplifier 652 of the second write/read circuit 650 may correspond to the fourth local bit line group BLG4.

An operation of the memory device 600 of FIG. 19 will be described below by assuming that at least one local bit line of the first local bit line group BLG1 and at least one local bit line of the second local bit line group BLG2 are selected.

The first write driver/sense amplifier 641 of the first write/read circuit 640 is activated and electrically connected to the first local bit line group BLG1 and drives a selected local bit line of the first local bit line group BLG1. Meanwhile, an inhibit voltage may be applied to the other local bit lines of the first local bit line group BLG1, according to a decoding operation related to an address of the first column decoder 620. Similarly, the second write driver/sense amplifier 642 of the first write/read circuit 640 is activated, and a selection voltage may be provided to the selected local bit line of the second local bit line group BLG2 and an inhibit voltage may be applied to the non-selected local bit lines.

Meanwhile, when the even bit lines Even BL of the memory cell array 610 are not selected, the second write/read circuit 650 may be non-activated. Also, according to the decoding operation related to an address of the second column decoder 630, switches included in the second column decoder 630 may be controlled to be turned on or off, and the even bit lines Even BL may become floated. Here, the biasing switch units 631 and 632 of the direction switch unit of the second column decoder 630 are enabled, and the inhibit voltage transferred via biasing switch units 631 and 632 may be provided to the non-selected even bit lines Even BL.

Figure 20:
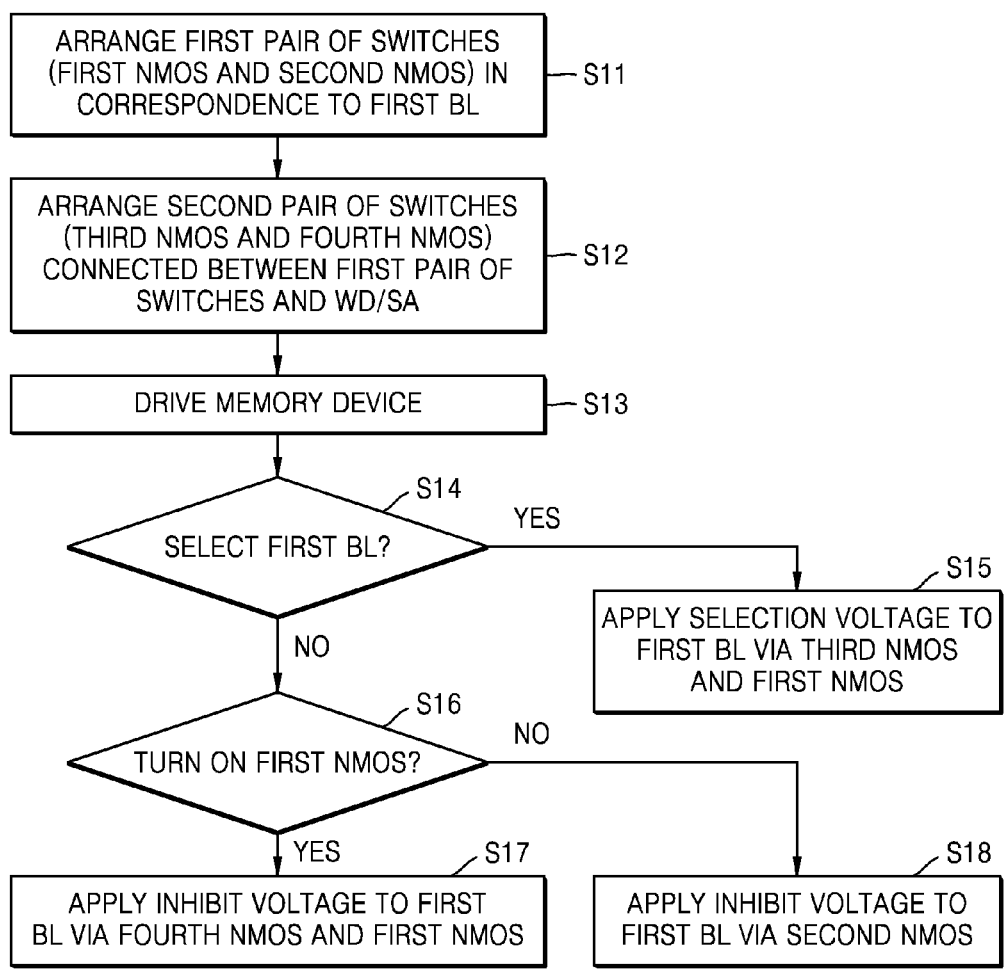
FIG. 20 is a flowchart illustrating a method of operating a memory device, according to an exemplary embodiment.

FIG. 20 is a flowchart illustrating a method of operating a memory device, according to an exemplary embodiment.

As illustrated in FIG. 20, a pair of switches (for example, a first pair of switches) may be arranged in correspondence to one local bit line (for example, a first bit line), and the first pair of switches may include a first NMOS transistor and a second NMOS transistors, as switches of the same type, in operation S11. Also, a pair of switches (for example, a second pair of switches) may be arranged in correspondence to a plurality of local bit lines, and the second pair of switches may be connected between the first pair of switches and a write driver/sense amplifier, in operation S12. The second pair of switches may include a third NMOS transistor and a fourth NMOS transistor, as switches of the same type, in operation S12.

As in the above-described exemplary embodiments, it may be configured that the selection voltage is transferred by only passing through the first NMOS transistor from among the first pair of switches. Also, the second NMOS transistor may transfer only the inhibit voltage. Also, according to a control state of the first pair of switches, the inhibit voltage may be transferred by selectively passing through the first NMOS transistor or the second NMOS transistor. Also, it may be configured that the third NMOS transistor may switch the selection voltage since the third NMOS transistor is connected to the write driver/sense amplifier. Also, the fourth NMOS transistor may switch the inhibit voltage since the fourth NMOS transistor is connected to the line transferring the inhibit voltage.

When the memory device is driven in operation S13, various memory operations according to commands of a memory controller may be performed. Whether the first bit line is selected may be determined by performing address decoding, in operation S14. If the first bit line is selected, the selection voltage is applied to the first bit line via a path passing through the write driver/sense amplifier, the third NMOS transistor, and the first NMOS transistor, in operation S15.

On the contrary, if the first bit line is not selected, the inhibit voltage may be transferred via different paths, depending on whether the first NMOS transistor connected to the first bit line is turned on. A determination of whether the first NMOS transistor is to be turned on is made in operation S16. For example, if the first NMOS transistor is turned on, the inhibit voltage is applied to the first bit line via a path passing through the fourth NMOS transistor and the first NMOS transistor, in operation S17. On the contrary, if the first NMOS transistor is turned off, the inhibit voltage is applied to the first bit line via a path passing through the second NMOS transistor, in operation S18.

Figure 21:
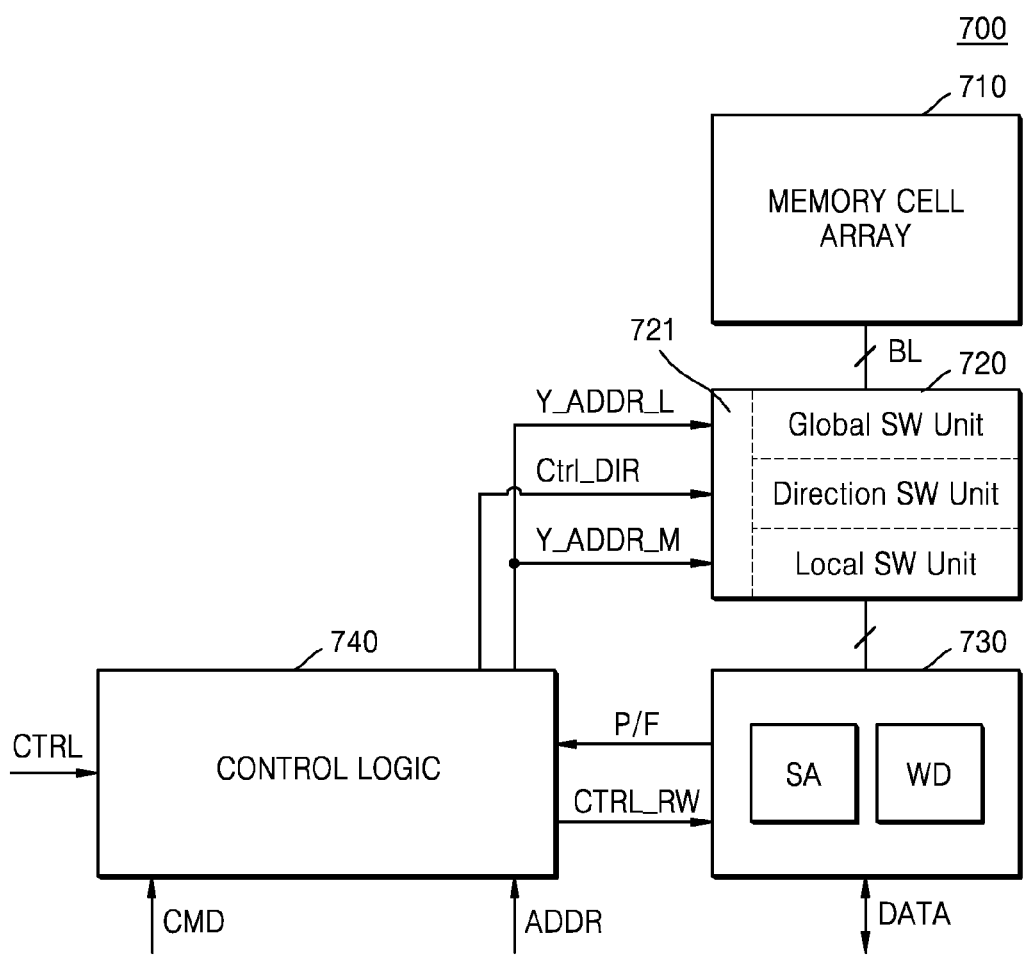
FIG. 21 is a block diagram illustrating a memory device according to another exemplary embodiment.

FIG. 21 is a block diagram illustrating a memory device 700 according to another exemplary embodiment. As illustrated in FIG. 21, the memory device 700 may include a memory cell array 710, a column decoder 720, a write/read circuit 730, and a control logic 740. The column decoder 720 may include a local switch unit, a direction switch unit, and a global switch unit. The control logic 740 may output various control signals CTRL_RW for writing data in the memory cell array 710 or reading data from the memory cell array 710, based on a command CMD, an address ADDR, and a control signal CTRL received from a memory controller. Also, the control logic 740 may receive a pass/fail signal P/F according to a result of determination with respect to the read data, from the write/read circuit 730. A region of the column decoder 720 that is illustrated with a dashed line corresponds to a decoding unit 721.

The control logic 740 may generate a column address Y_ADDR from the address ADDR. Some bits Y_ADDR_M of the column address Y_ADDR include information about a region in which selected local bit lines are included. The column decoder 720 may decode some bits Y_ADDR_M of the column address Y_ADDR in order to control a state of switches in the global switch unit.

Also, other bits Y_ADDR_L of the column address Y_ADDR include information about the selected local bit lines. That is, a bit line selection operation may be performed in a hierarchical structure, and any bit line may be selected from any bit line group selected by the global switch unit, according to a result of decoding the bits Y_ADDR_L.

Meanwhile, according to the present exemplary embodiment, the control logic 740 may generate an additional control signal Ctrl_DIR and provide the generated control signal Ctrl_DIR to the column decoder 720, for biasing with respect to selection bit lines and non-selected bit lines, and for bidirectional driving with respect to the memory cells. The control logic 740 may determine whether the memory cell array 710 is selected, based on the column address Y_ADDR, and may determine a direction in which the current memory cell is to be driven, based on the command CMD. The direction switch unit may be controlled by the control signal Ctrl_DIR so that the memory cells are driven according to a first polarity or a second polarity. Also, according to whether the memory cell array 710 is selected, the direction switch unit may control a biasing switch unit (not shown) therein, based on the control signal Ctrl_DIR, in order to prevent the local bit lines BL included in the memory cell 710 from being floated.

Figure 22:
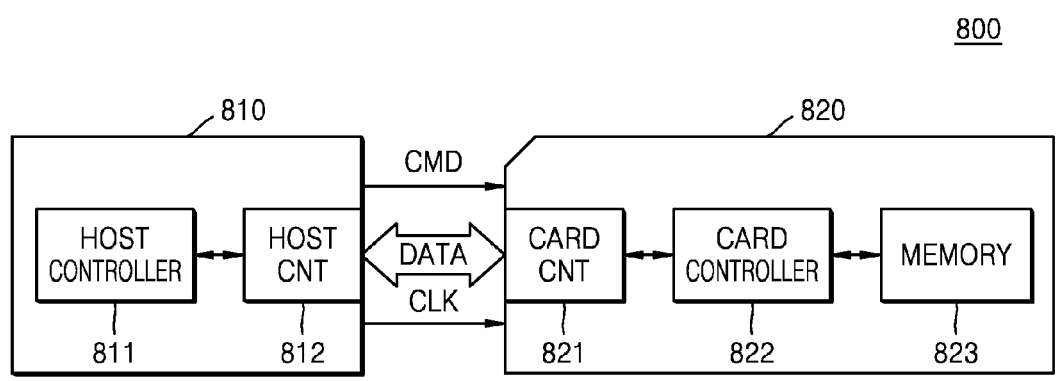
FIG. 22 is a block diagram illustrating a memory card system to which a memory system according to an exemplary embodiment is applied.

FIG. 22 is a block diagram illustrating a memory card system 800 to which a memory system according to an exemplary embodiment is applied. The memory system is assumed to be a resistive memory system.

Referring to FIG. 22, the memory card system 800 may include a host 810 and a memory card 820. The host 810 may include a host controller 811 and a host connector 812. The memory card 820 may include a card connector 821, a card controller 822, and a memory device 823. Here, the memory device 823 may be implemented using the exemplary embodiments shown in FIGS. 1 through 21, and accordingly, the memory device 823 may include a column decoder, and the column decoder may bi-directionally drive memory cells. Also, the memory device 823 may provide appropriate biasing to a selection bit line and a non-selected bit line.

The host 810 may write data to the memory card 820 or may read data stored in the memory card 820. The host controller 811 may transmit a command CMD, a clock signal CLK generated by a clock generator (not shown) in the host 810, and data DATA to the memory card 820 via the host connector 812.

In response to the command CMD received via the card connector 821, the card controller 822 may store the data DATA in the memory device 823, in synchronization with a clock signal that is generated by a clock generator (not shown) in the card controller 822. The memory device 823 may store the data DATA that is transmitted from the host 810.

The memory card 820 may be implemented as a compact flash card (CFC), a Microdrive, a smart media card (SMC), a multimedia card (MMC), a security digital card (SDC), a memory stick, or a universal serial bus (USB) flash memory drive.

Figure 23:
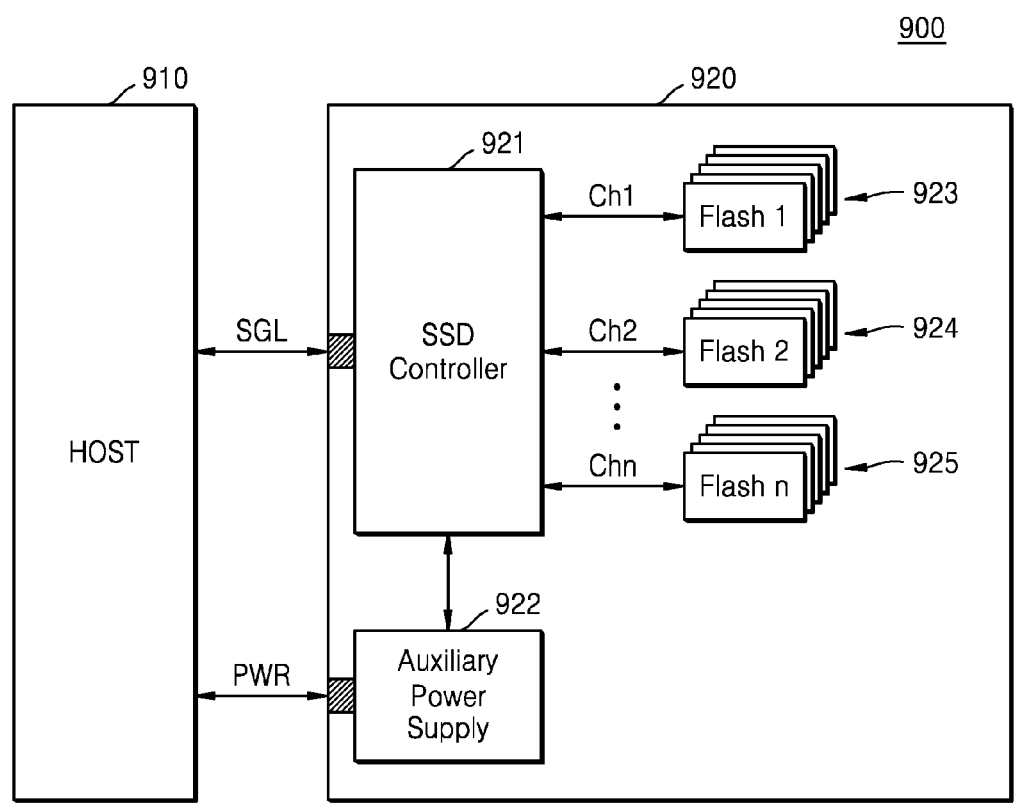
FIG. 23 is a block diagram illustrating a memory system according to exemplary embodiments, applied to a Solid State Disk/Drive (SSD) system.

FIG. 23 is a block diagram illustrating a memory system according to exemplary embodiments, applied to an SSD system 900.

Referring to FIG. 23, the SSD system 900 may include a host 910 and an SSD 920. The SSD 920 receives or transmits a signal SGL from or to the host 910 via a signal connector, and receives power PWR via a power connector. The SSD 920 may include an SSD controller 921, an auxiliary power supply 922, and a plurality of memory devices 923, 924, and 925. The SSD 920 may be implemented using the embodiments illustrated in FIGS. 1 through 21, and accordingly, each of the memory devices 923, 924, and 925 may include a column decoder that may bi-directionally drive memory cells. Also, the memory devices 923, 924, and 925 may provide appropriate biasing to a selection bit line and a non-selected bit line.

Figure 24:
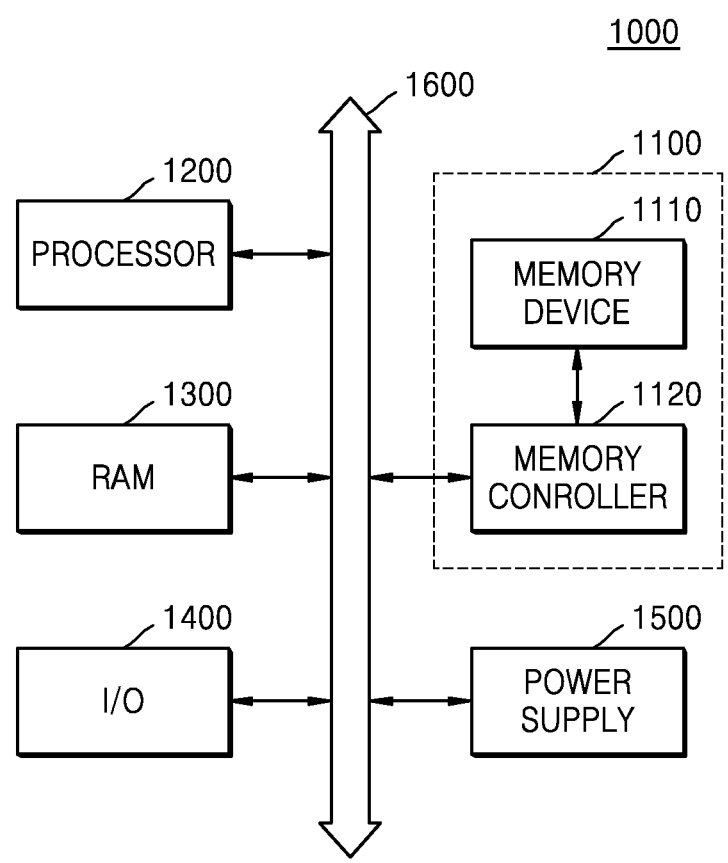
FIG. 24 is a block diagram illustrating a computing system including a memory system according to exemplary embodiments.

FIG. 24 is a block diagram illustrating a computing system 1000 including a memory system 1100 according to exemplary embodiments. The memory system 1100 is assumed to be a resistive memory system.

Referring to FIG. 24, the computing system 1000 may include the memory system 1100, a processor 1200, RAM 1300, an input/output (I/O) device 1400, and a power supply device 1500. The memory system 1100 may also include a memory device 1110 and a memory controller 1120. Although not illustrated in FIG. 24, the computing system 1000 may further include ports capable of communicating with a video card, a sound card, a memory card, or a USB device, or other electronic devices. The computing system 1000 may be embodied as a PC, or a portable electronic device such as a notebook computer, a mobile phone, a personal digital assistant (PDA), or a camera.

The processor 1200 may perform particular calculations or tasks. In one or more exemplary embodiments, the processor 1200 may be a micro-processor, a Central Processing Unit (CPU), or the like. The processor 1200 may perform communication with the RAM 1300, the I/O device 1400, and the memory system 1100 via a bus 1600 such as an address bus, a control bus, or a data bus. Here, the memory system 1100 and/or the RAM 1300 may be implemented using the embodiments shown in FIGS. 1 through 21.

In some exemplary embodiments, the processor 1200 may also be connected to an extended bus such as a Peripheral Component Interconnect (PCI) bus.

The RAM 1300 may store data for operations of the computing system 1000. As described above, the memory device according to the one or more exemplary embodiments of the disclosure may be applied to the RAM 1300. Alternatively, DRAM, mobile DRAM, SRAM, PRAM, FRAM, or MRAM may be used as the RAM 1300.

The I/O device 1400 may include an input unit such as a keyboard, a keypad, or a mouse, and an output unit such as a printer or a display. The power supply device 1500 may supply an operating voltage for the operations of the computing system 1000.

While the disclosure has been particularly shown and described with reference to exemplary embodiments thereof, it will be understood that various changes in form and details may be made therein without departing from the spirit and scope of the following claims.

What is claimed is:

1. A resistive memory device comprising:
  a memory cell array comprising memory cells connected to a plurality of signal lines; and
  a column decoder comprising a first switch unit comprising at least two pairs of switches arranged in correspondence to each of the plurality of signal lines and a second switch unit comprising a pair of switches arranged in correspondence to the at least two pairs of switches of the first switch unit, wherein:
  the first switch unit comprises a first pair of switches connected to a first signal line, wherein the first pair of switches comprises a first switch and a second switch that are of the same type, and the second switch unit comprises a second pair of switches comprising a third switch and a fourth switch that are connected to the first pair of switches, and
  a selection voltage is provided to the first signal line by passing through the first switch, and an inhibit voltage is provided to the first signal line by selectively passing through the first switch or the second switch.

2. The resistive memory device of claim 1, wherein the plurality of signal lines are word lines or bit lines.

3. The resistive memory device of claim 1, wherein the first switch comprises a first NMOS transistor and the second switch comprises a second NMOS transistor.

4. The resistive memory device of claim 3, wherein:
  the third switch comprises a third NMOS transistor connected between a first line transferring the selection voltage and an end of the first NMOS transistor, and
  the fourth switch comprises a fourth NMOS transistor connected between a second line transferring the inhibit voltage and the end of the first NMOS transistor.

5. The resistive memory device of claim 4, wherein:
  the first NMOS transistor is connected to a node between the third NMOS transistor and the fourth NMOS transistor, and the second NMOS transistor is connected to the second line.

6. The resistive memory device of claim 4, wherein the first NMOS transistor is switched in response to a first control signal, and the second NMOS transistor is switched in response to a first complementary control signal.

7. The resistive memory device of claim 6, wherein the third NMOS transistor is switched in response to a second control signal, and the fourth NMOS transistor is switched in response to a second complementary control signal.

8. The resistive memory device of claim 1, wherein when the first signal line is selected, the selection voltage is provided to the first signal line by using an exclusive path comprising the third switch and the first switch.

9. The resistive memory device of claim 1, wherein when the first signal line is not selected, the inhibit voltage is provided to the first signal line via the second switch, depending on a switching state of the first pair of switches.

10. The resistive memory device of claim 1, wherein when the first signal line is not selected, the inhibit voltage is provided to the first signal line via the fourth switch and the first switch, depending on a switching state of the first pair of switches.

11. The resistive memory device of claim 1, wherein:
the column decoder further comprises a first line transferring the selection voltage, a second line transferring the inhibit voltage, and a third line arranged as a voltage transfer path,
the first switch is connected between the first signal line and the third line,
the second switch is connected between the first signal line and the second line,
the third switch is connected between the first line and the third line, and
the fourth switch is connected between the second line and the third line.

12. The resistive memory device of claim 1, wherein:
the first switch unit further comprises pairs of switches arranged in correspondence to each of second through nth signal lines (n is an integer that is equal to or greater than 2), and
the second pair of switches of the second switch unit are connected commonly to first through nth pairs of switches of the first switch unit.

13. The resistive memory device of claim 12, wherein:
each of the first through nth pairs of switches of the first switch unit comprises the first switch and the second switch that are of the same type, and
with respect to pairs of switches not being selected of the first switch unit, some pairs of switches transfer the inhibit voltage via the first switch, and others of the pairs of switches transfer the inhibit voltage via the second switch.

14. A resistive memory device comprising:
a memory cell array comprising memory cells connected to a plurality of signal lines;
a column decoder comprising a first switch unit comprising switches that are arranged in correspondence to each of the plurality of signal lines in order to drive the plurality of signal lines, and a second switch unit comprising switches adjusting a voltage transfer path in order to bi-directionally drive the memory cells; and
a write/read circuit performing write and read operations with respect to the memory cells via the column decoder, wherein
the second switch unit further comprises a biasing switch unit controlling an inhibit voltage to be provided to at least one of the plurality of signal lines via an additional voltage transfer path, regardless of the bidirectional driving with respect to the plurality of signal lines.

15. The resistive memory device of claim 14, wherein the first switch unit comprises:
a first pair of switches having a CMOS structure and connected to a first signal line, and
a first NMOS transistor of the first pair of switches is connected to a first line transferring one of a selection voltage and the inhibit voltage, and a first PMOS transistor of the first pair of switches is connected to a second line transferring the other of the selection voltage and the inhibit voltage.

16. The resistive memory device of claim 15, wherein the second switch unit comprises a second pair of switches connected to the first line and a third pair of switches connected to the second line, as switches for bi-directionally driving the memory cells.

17. The resistive memory device of claim 16, wherein:
when the memory cells are driven according to a first polarity, the second pair of switches provide the selection voltage to the first line and the third pair of switches provide the inhibit voltage to the second line, and
when the memory cells are driven according to a second polarity, the second pair of switches provide the inhibit voltage to the first line and the third pair of switches provide the selection voltage to the second line.

18. The resistive memory device of claim 15, wherein the biasing switch unit comprises a first switch transferring the inhibit voltage to the first line and a second switch transferring the inhibit voltage to the second line.

19. The resistive memory device of claim 18, wherein:
the second switch unit comprises at least one pair of switches for bi-directionally driving the memory cells, in correspondence to a signal line group comprising the plurality of signal lines, and
when the at least one pair of switches are activated as the signal line group is selected, the biasing switch unit is non-activated.

20. The resistive memory device of claim 18, wherein:
the second switch unit comprises at least one pair of switches for bi-directionally driving the memory cells, in correspondence to a signal line group comprising the plurality of signal lines, and
when the at least one pair of switches are non-activated as the signal line group is not selected, the biasing switch unit is activated.

* * * * *